(12) United States Patent
Chino

(10) Patent No.: US 8,431,441 B2
(45) Date of Patent: Apr. 30, 2013

(54) SEMICONDUCTOR PACKAGE AND METHOD OF MANUFACTURING SAME

(75) Inventor: Teruaki Chino, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 14 days.

(21) Appl. No.: 13/094,316

(22) Filed: Apr. 26, 2011

(65) Prior Publication Data

US 2011/0272800 A1 Nov. 10, 2011

(30) Foreign Application Priority Data

May 10, 2010 (JP) ................................. 2010-108688

(51) Int. Cl.
*H01L 21/56* (2006.01)
*H01L 21/301* (2006.01)

(52) U.S. Cl.
USPC ..... 438/113; 438/124; 438/126; 257/E21.504

(58) Field of Classification Search .................. 438/113, 438/124, 126; 257/E21.504
See application file for complete search history.

(56) References Cited

U.S. PATENT DOCUMENTS 7,595,228 B2 * 9/2009 Abe et al. ....................... 438/123

FOREIGN PATENT DOCUMENTS

WO WO 02/15266 2/2002
WO WO 02/33751 4/2002

* cited by examiner

*Primary Examiner* — Zandra V. Smith
*Assistant Examiner* — Toniae Thomas
(74) *Attorney, Agent, or Firm* — IPUSA, PLLC

(57) ABSTRACT

A method of manufacturing a semiconductor package includes placing a semiconductor chip in a recess provided on a surface of a supporting body so that a part of the semiconductor chip projects from the recess; forming a resin part on the surface of the supporting body, the resin part encapsulating the projecting part of the semiconductor chip; removing the supporting body; and forming an interconnection structure electrically connected to the semiconductor chip by using the resin part as a part of the base body of the semiconductor package.

12 Claims, 18 Drawing Sheets

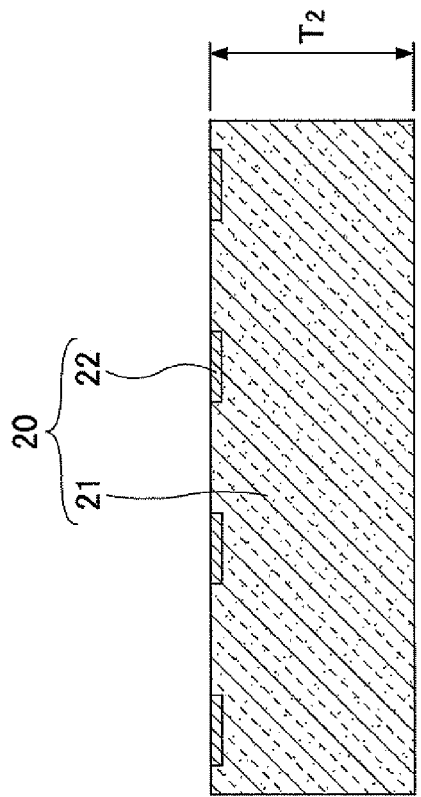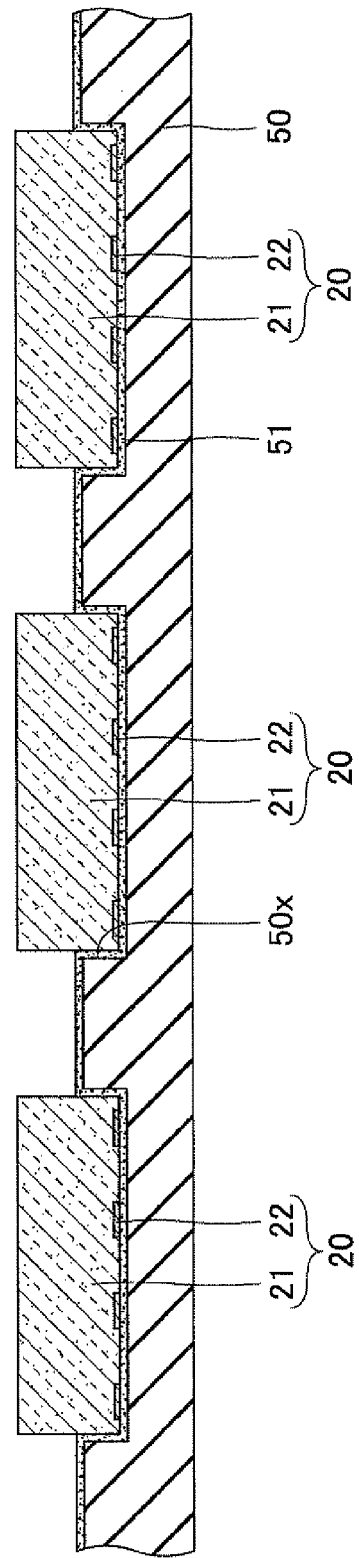

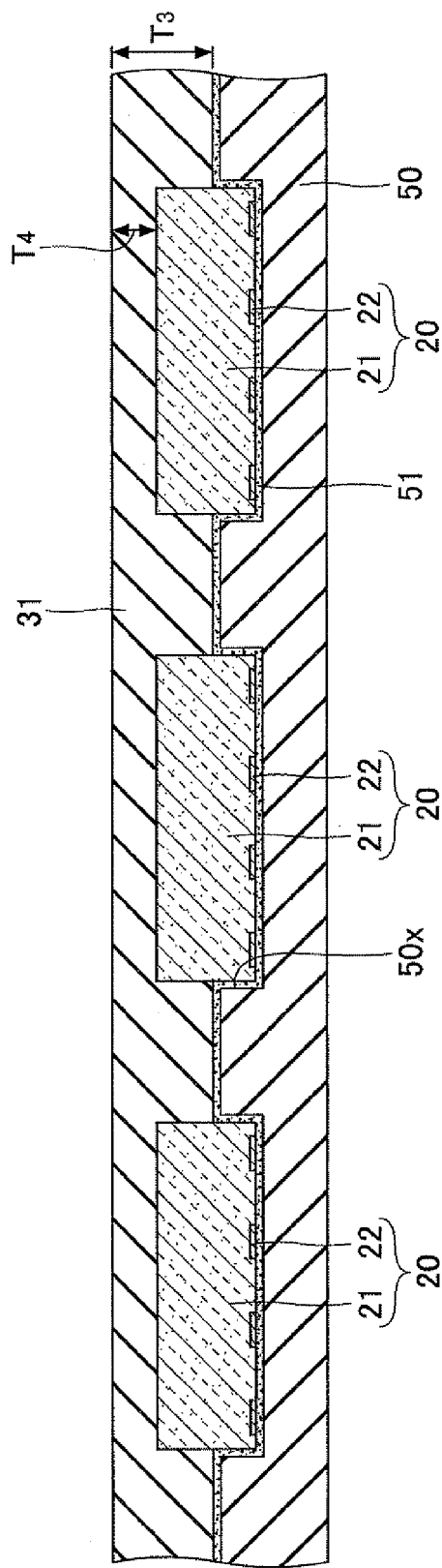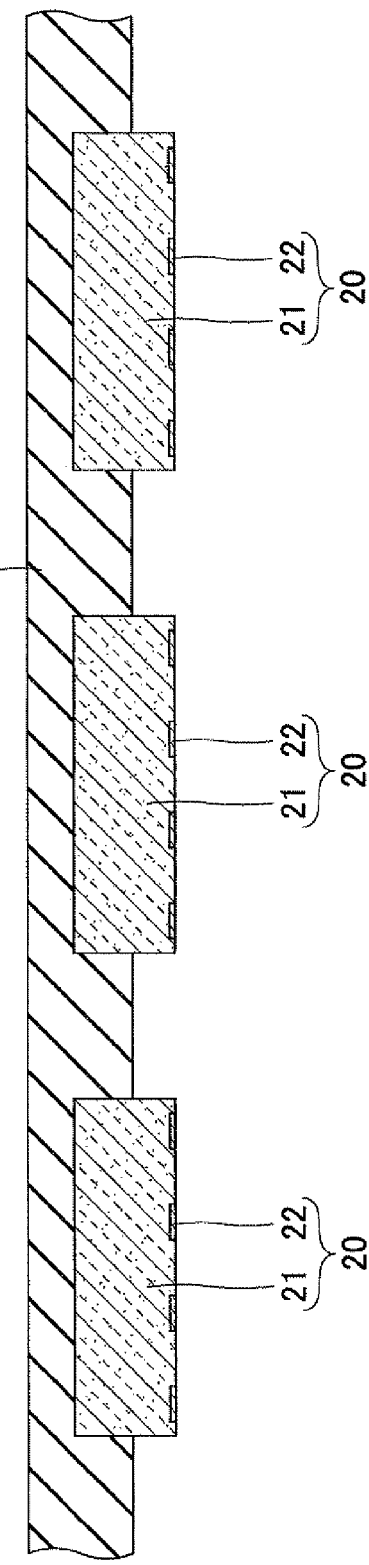

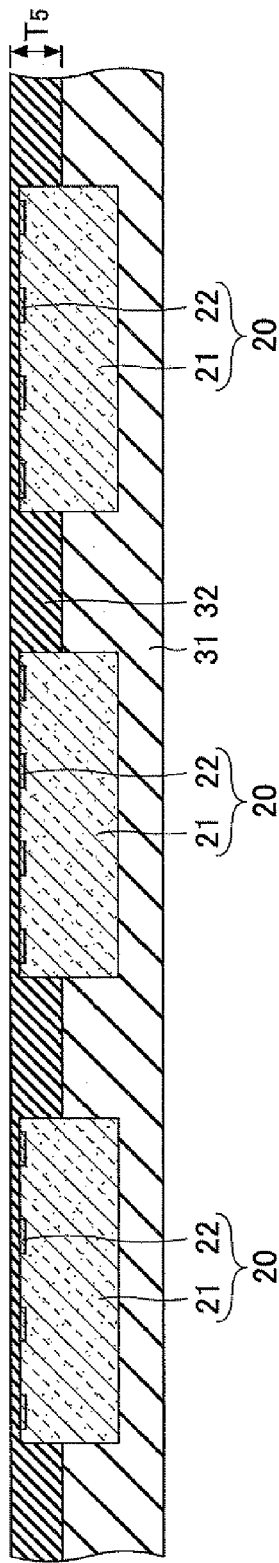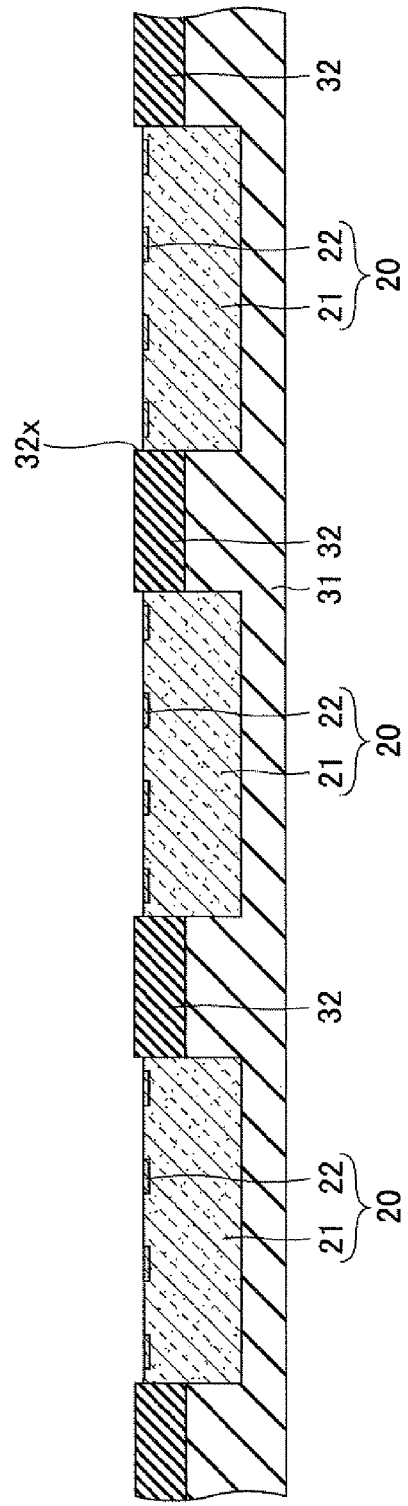

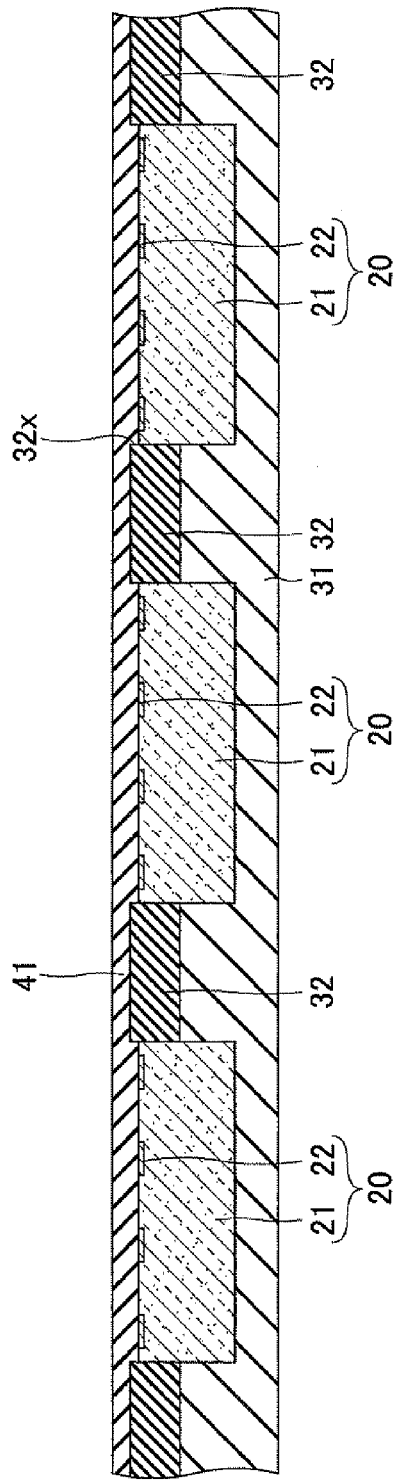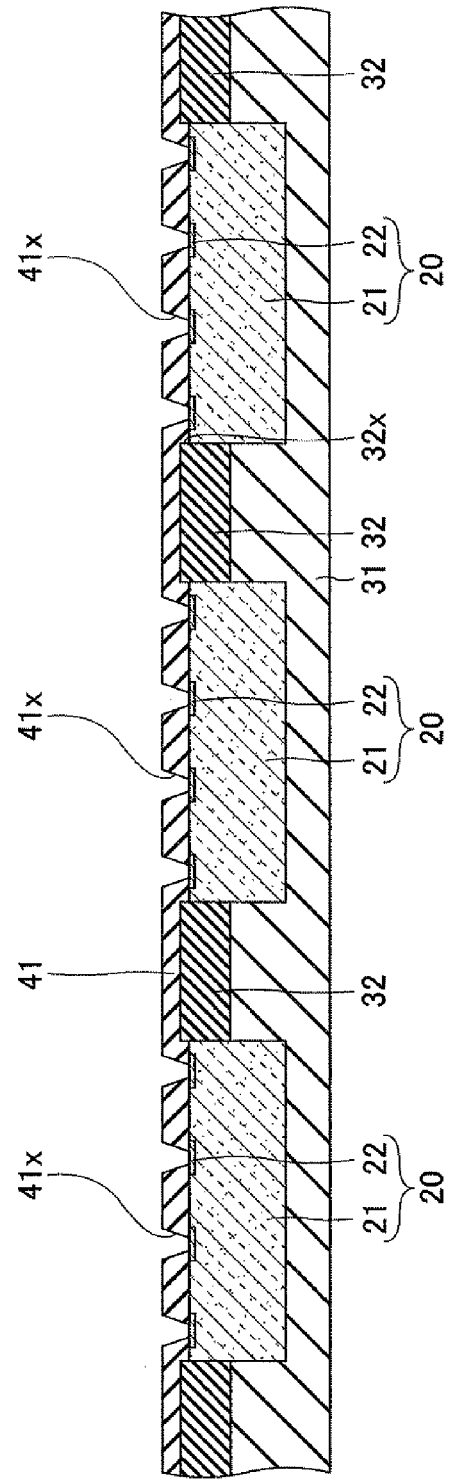

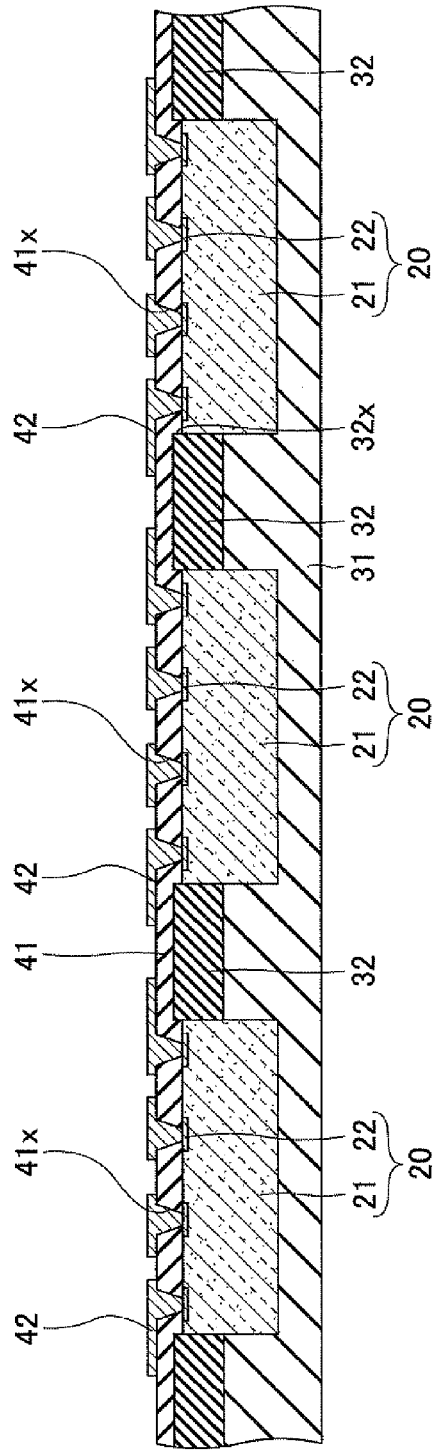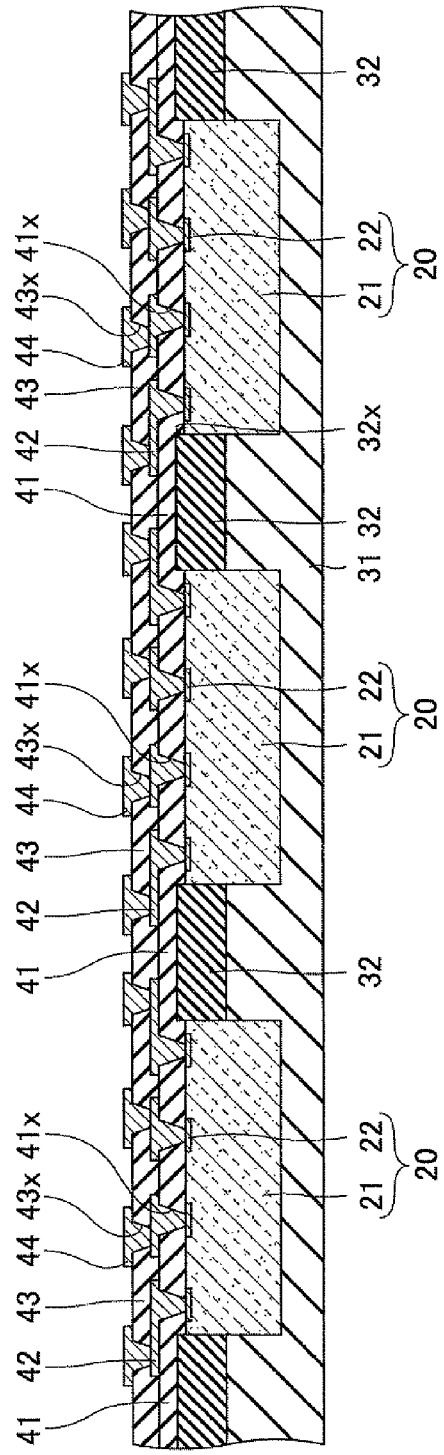

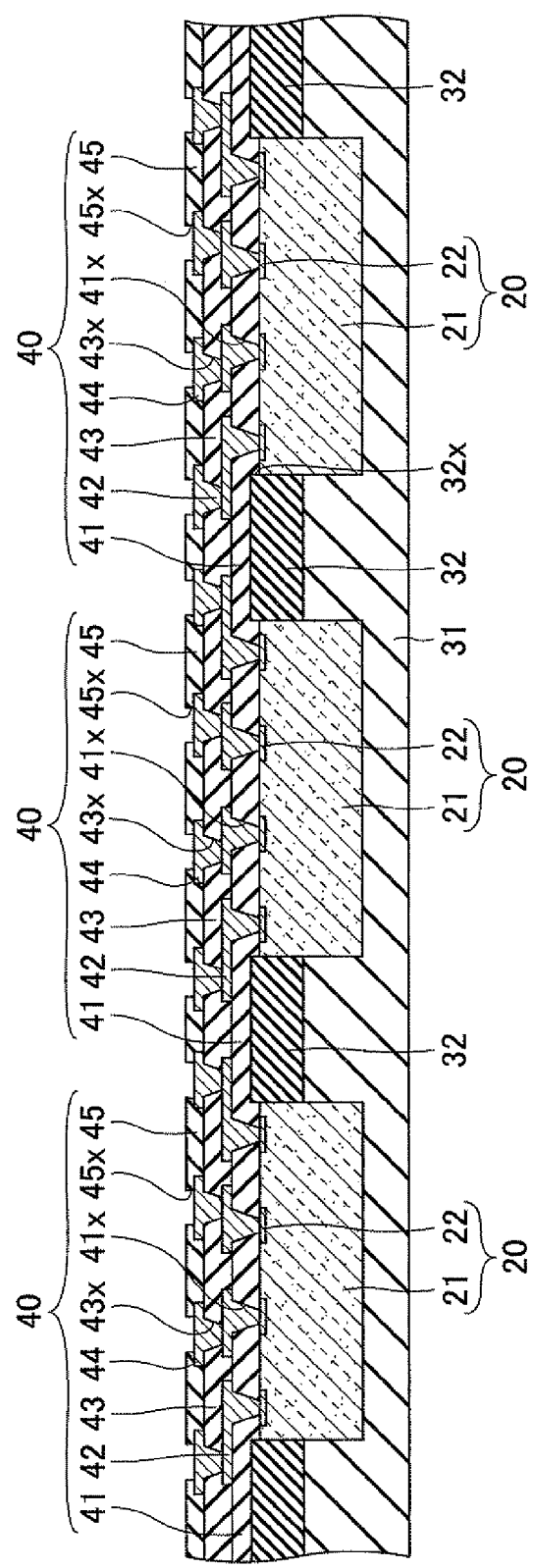

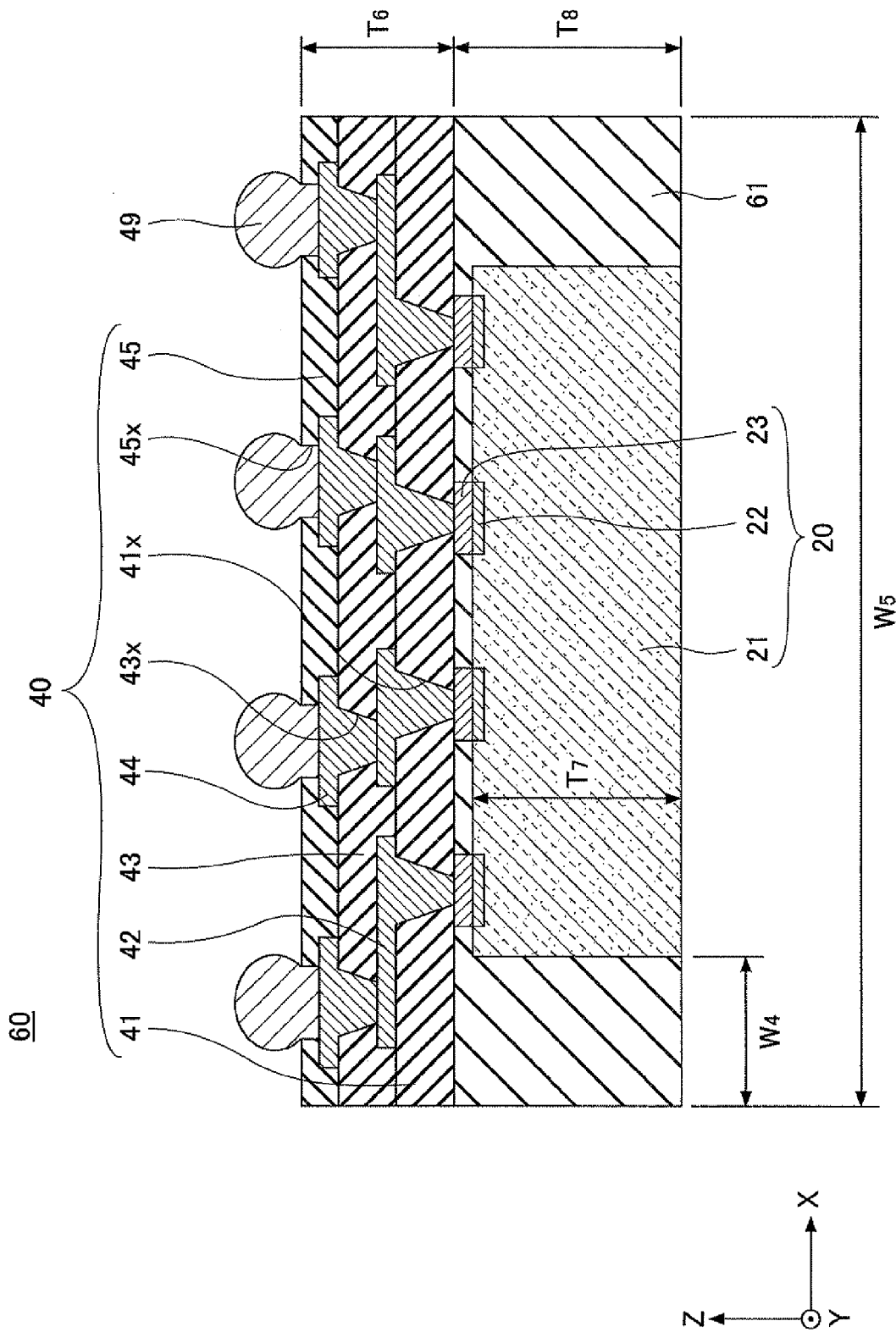

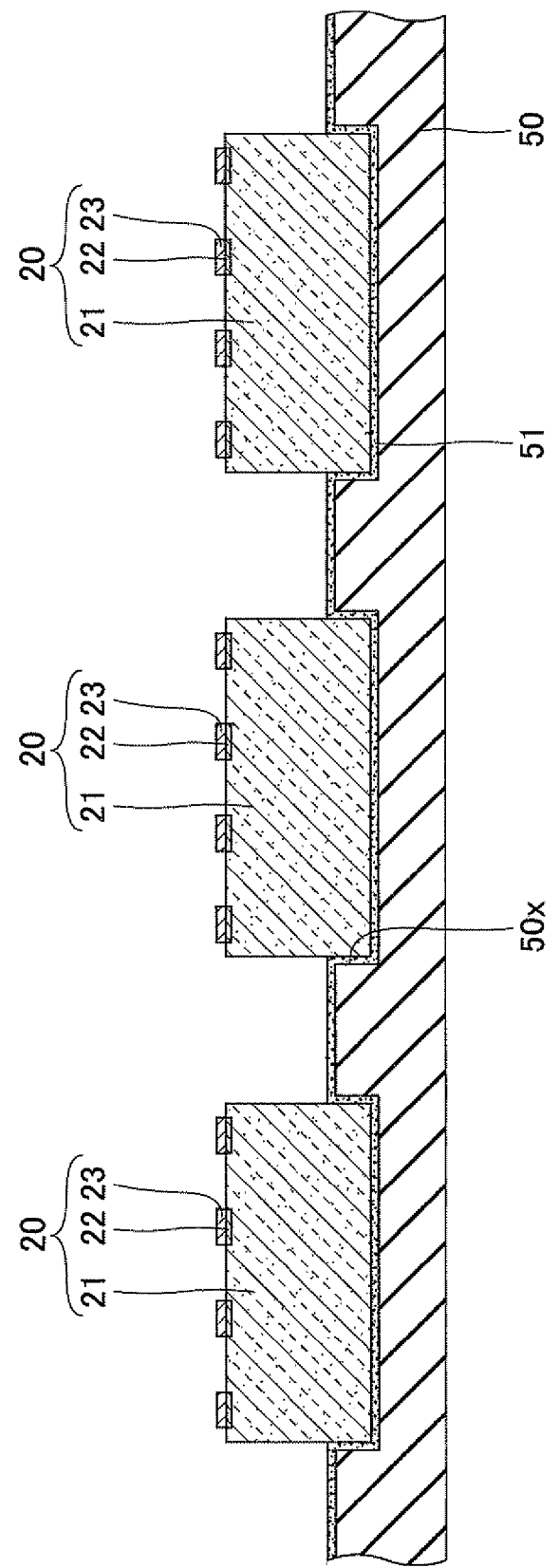

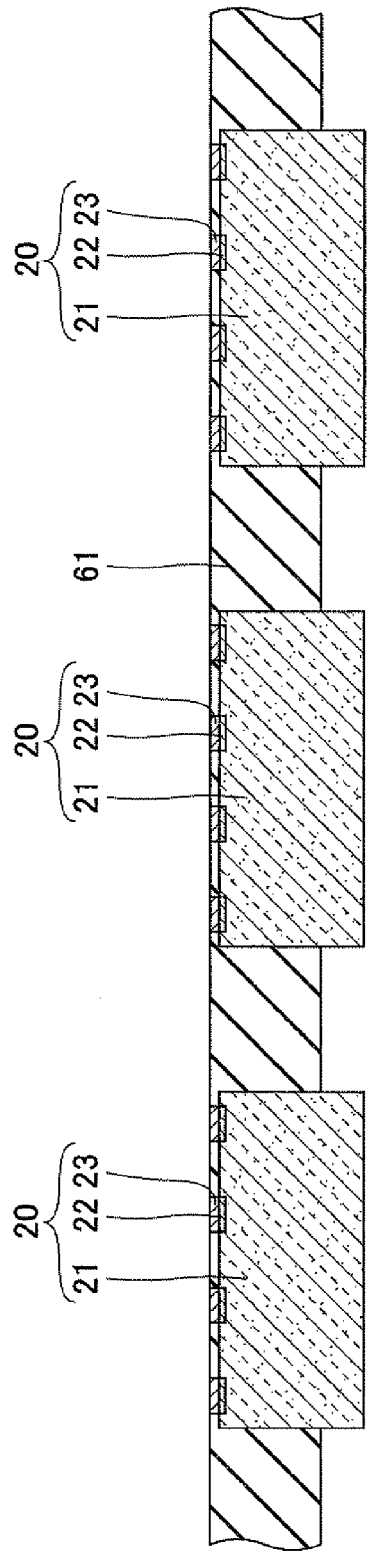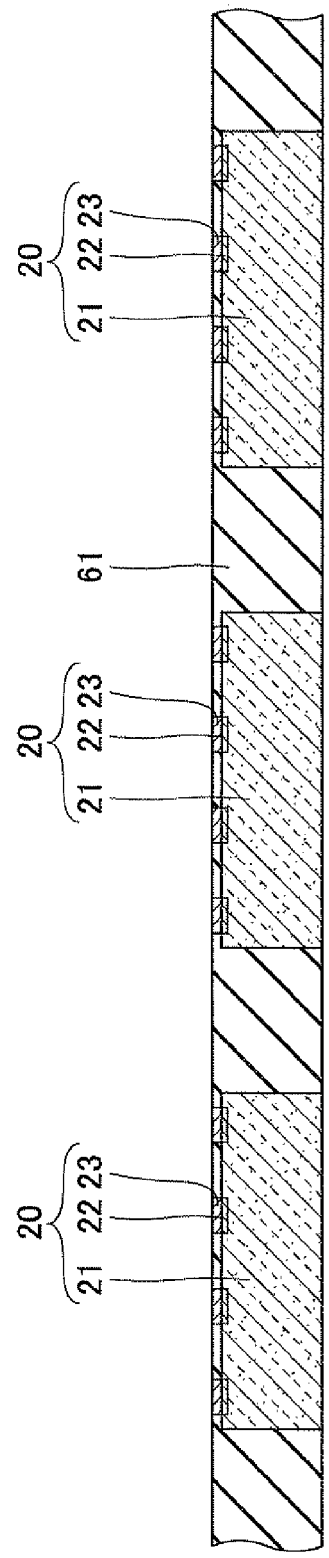

SEMICONDUCTOR PACKAGE AND METHOD OF MANUFACTURING SAME

CROSS-REFERENCE TO RELATED APPLICATION

This application is based upon and claims the benefit of priority of the prior Japanese Patent Application No. 2010-108688, filed on May 10, 2010, the entire contents of which are incorporated herein by reference.

FIELD

A certain aspect of the embodiments discussed herein is related to a semiconductor package and a method of manufacturing the semiconductor package.

BACKGROUND

The molding technique of arranging multiple semiconductor chips on a supporting body that is, for example, circular in planar shape and encapsulating the arranged semiconductor chips together with resin is known as a conventional method of manufacturing a semiconductor package. A description is given below, with reference to FIGS. 1A through 1C, of the conventional method of manufacturing a semiconductor package.

FIGS. 1A through 1C are diagrams illustrating the conventional method of manufacturing a semiconductor package.

First, as illustrated in FIG. 1A, multiple semiconductor chips 120 are arranged on an adhesive layer 110 on a supporting body 100. For example, the semiconductor chips 120 are arranged with their respective circuit surfaces (surfaces on which circuits are formed) facing toward the supporting body 100.

Next, as illustrated in FIG. 1B, the semiconductor chips 120 are encapsulated together with resin 130. Such a molding technique is advantageous in that it is possible to coat a wide area evenly with the resin 130 and to encapsulate the multiple semiconductor chips 120 together.

For related art, reference may be made to, for example, International Publication Pamphlet No. WO 02/15266 and International Publication Pamphlet No. WO 02/33751.

SUMMARY

According to an aspect of the invention, a method of manufacturing a semiconductor package includes placing a semiconductor chip in a recess provided on a surface of a supporting body so that a part of the semiconductor chip projects from the recess; forming a resin part on the surface of the supporting body, the resin part encapsulating the projecting part of the semiconductor chip; removing the supporting body; and forming an interconnection structure electrically connected to the semiconductor chip by using the resin part as a part of a base body of the semiconductor package.

According to an aspect of the invention, a semiconductor package includes a semiconductor chip; a resin part exposing a circuit surface of the semiconductor chip and encapsulating at least side surfaces of the semiconductor chip; and an interconnection structure formed on the resin part and on the circuit surface of the semiconductor chip, the interconnection structure including an insulating layer and an interconnection layer, wherein the resin part includes a structure having a first resin part and a second resin part stacked on the first resin part, the second resin part being in contact with the insulating layer.

According to an aspect of the invention, a semiconductor package includes a semiconductor chip; a resin part exposing a surface of a bump electrode formed at a circuit surface of the semiconductor chip and encapsulating the circuit surface and side surfaces of the semiconductor chip; and an interconnection structure formed on the resin part, the interconnection structure including an insulating layer and an interconnection layer, wherein a surface of the resin part exposing the surface of the bump electrode is in contact with the insulating layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIGS. 1A through 1G are diagrams illustrating a conventional method of manufacturing a semiconductor package;

FIG. 4 is a cross-sectional view of a semiconductor package according to a second embodiment; and FIGS. 5A through 5E are diagrams illustrating a method of manufacturing a semiconductor package according to the second embodiment.

DESCRIPTION OF EMBODIMENTS

As described above, according to the conventional method of manufacturing a semiconductor package, the multiple semiconductor chips 120 are encapsulated together with the resin 130.

Figure 1A:
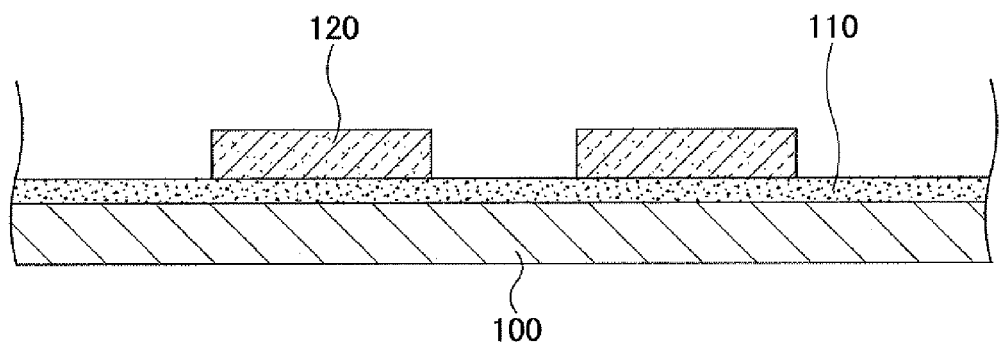
Figure 1B:
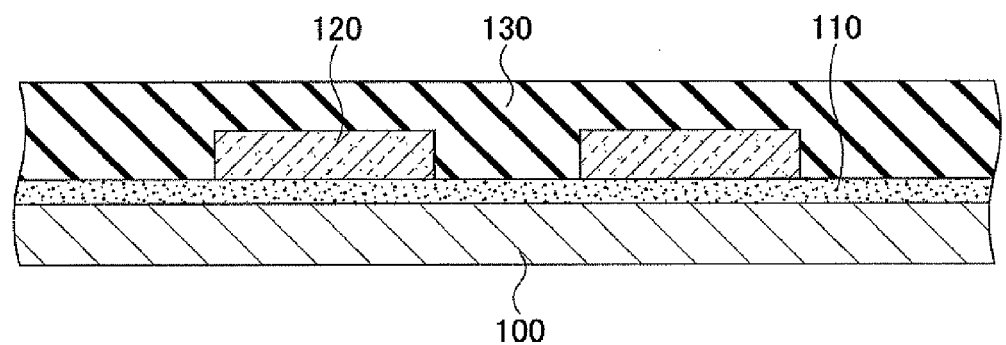
Figure 1C:
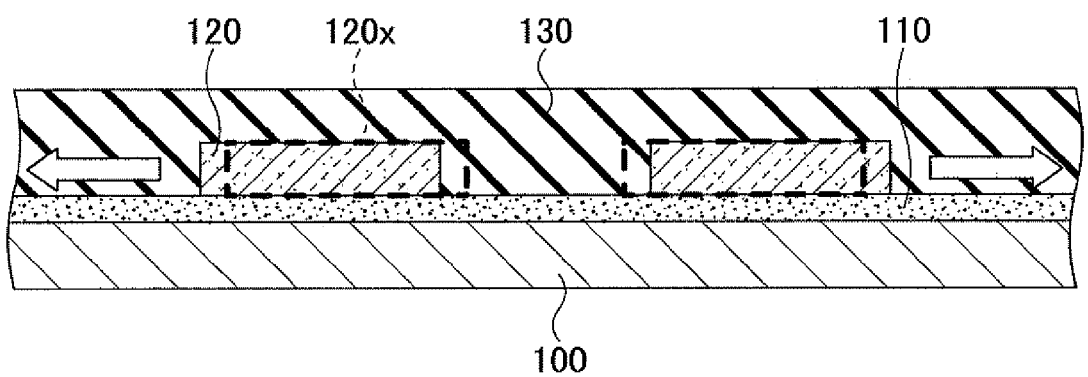

However, as illustrated in FIG. 1C, encapsulating the multiple semiconductor chips 120 together with the resin 130 has a problem in that the individual semiconductor chips 120 are, for example, moved in directions indicated by arrows by a flow of the resin 130, and are thus displaced and fixed to positions different from where the semiconductor chips 120 are supposed to be fixed. In FIG. 10, the semiconductor chips 120 are fixed at positions shifted from positions 120x where the semiconductor chips 120 are supposed to be fixed. The flow of the resin 130 is caused by pressing the resin 130 at the time of encapsulating in order to make the thickness of the resin 130 uniform.

For example, the process illustrated in FIG. 10 is followed by processes such as a process for exposing the circuit surfaces of the semiconductor chips 120 by removing the supporting body 100 and the adhesive layer 110 and a process for stacking an insulating layer and an interconnection layer on the circuit surfaces of the semiconductor chips 120 and electrically connecting the interconnection layer and electrode pads on the circuit surfaces of the semiconductor chips 120 with via interconnects formed through the insulating layer. At this point, if the semiconductor chips 120 are fixed at positions different from where the semiconductor chips 120 are supposed to be fixed, the electrode pads of the semiconductor chips 120 and the via interconnects are misaligned, so that the reliability of the connections between the semiconductor chips 120 and the interconnection layer may be reduced.

The problem of the fixation of the semiconductor chips 120 at positions different from where the semiconductor chips 120 are supposed to be fixed may be improved to some extent by increasing the adhesion of the adhesive layer 110. However, an increase in the adhesion of the adhesive layer 110 results in the adhesion of portions of the adhesive layer 110 to the upper surfaces of electrode pads of the semiconductor chips 120 when removing the adhesive layer 110. Therefore, the reliability of the connections between the semiconductor chips 120 and the interconnection layer may be reduced. Accordingly, this technique is not preferable.

According to an aspect of the present invention, a semiconductor package that makes it possible to prevent the displacement of semiconductor chips at the time of encapsulating the semiconductor chips with resin and a method of manufacturing the semiconductor package are provided.

A description is given, with reference to the accompanying drawings, of preferred embodiments of the present invention. In the drawings, the same elements or components are referred to by the same reference characters or numerals, and a redundant description thereof may be omitted.

[a] First Embodiment

A description is given of a structure of a semiconductor package according to a first embodiment.

Figure 2:
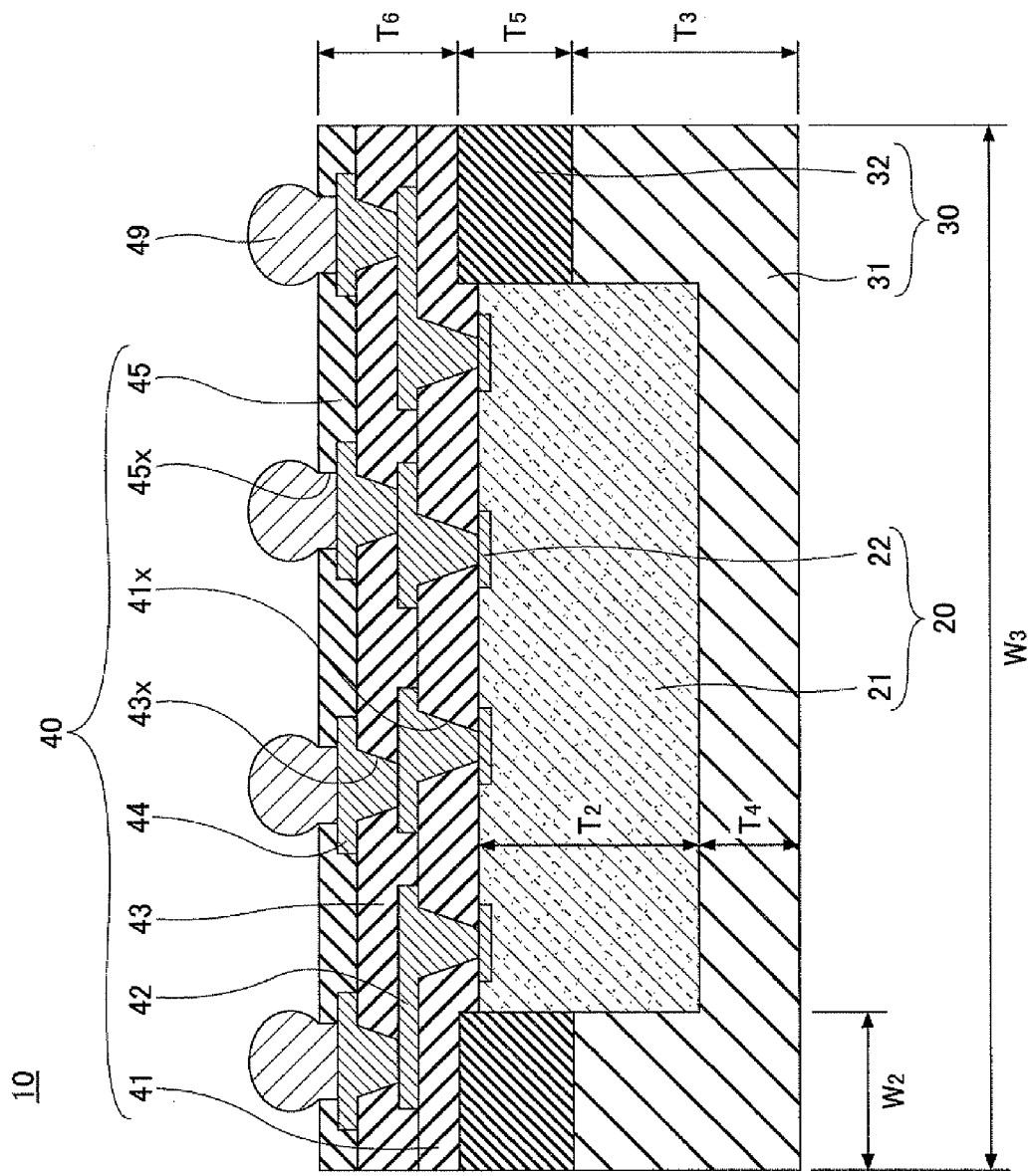
FIG. 2 is a cross-sectional view of a semiconductor package according to a first embodiment.

FIG. 2 is a cross-sectional view of a semiconductor package 10 according to the first embodiment.

Referring to FIG. 2, the semiconductor package 10 includes a semiconductor chip 20, a resin part 30, an interconnection structure 40, and external connection terminals 49. The interconnection structure 40 may be extremely thin and is formed on a surface formed by the semiconductor chip 20 and the resin part 30. The external connection terminals 49 are formed on the interconnection structure 40. The semiconductor chip 20 and the interconnection structure 40 are directly connected without use of solder bumps or the like.

The semiconductor package 10 may be, for example, rectangular in planar shape. In terms of size, the semiconductor package 10 may be, for example, approximately 15 mm in width (the direction of X), approximately 15 mm in depth (or length) (the direction of Y), and approximately 0.8 mm in thickness (the direction of Z). The semiconductor package 10 may be further reduced to, for example, 0.3 mm to 0.5 mm in thickness. A description is given below of the semiconductor chip 20, the resin part 30, the interconnection structure 40, and the external connection terminals 49 of the semiconductor package 10.

The semiconductor chip 20 includes a semiconductor substrate 21 and electrode pads 22. The semiconductor substrate 21 includes a substrate of, for example, silicon (Si), germanium (Ge) or the like and a semiconductor integrated circuit (not graphically illustrated) formed on the substrate. The electrode pads 22 are formed on one side of the semiconductor substrate 21 and are electrically connected to its semiconductor integrated circuit (not graphically illustrated). Examples of the material of the electrode pads 22 include aluminum (Al); copper (Cu) and aluminum (Al) stacked in layers in this order; and copper (Cu), aluminum (Al), and silicon (Si) stacked in layers in this order. The pitch between adjacent electrode pads 22 may be, for example, approximately 100 μm. The semiconductor chip 20 may have a thickness $T_2$ of, for example, approximately 300 μm to approximately 800 μm.

In the semiconductor chip 20, the surface on the side on which the electrode pads 22 are formed is a circuit surface (a surface on which a circuit is formed). Hereinafter, in the semiconductor chip 20, a surface on the side opposite to the circuit surface and substantially parallel to the circuit surface may be referred to as "bottom surface." Further, in the semiconductor chip 20, a surface substantially perpendicular to the circuit surface and the bottom surface may be referred to as "side surface."

The resin part 30 includes a first resin part 31 and a second resin part 32. The first resin part 31 is formed to encapsulate the entire bottom surface and part of the side surfaces of the semiconductor chip 20. The second resin part 32 is formed on the first resin part 31 to encapsulate the remaining part (not encapsulated by the first resin part 31) of the side surfaces of the semiconductor chip 20. In other words, the bottom surface of the semiconductor chip 20 is encapsulated with the first resin part 31 and the side surfaces of the semiconductor chip 20 are encapsulated with the first resin part 31 and the second resin part 32. Examples of materials for the first resin part 31 and the second resin part 32 include insulating resins such as epoxy resin and polyimide resin.

Since the first resin part 31 forms part of the base body of the semiconductor package 10, it is preferable to use a resin material better in hardness or strength than in processability for the first resin part 31. The second resin part 32 is subject to no such restriction, and enjoys more latitude of material choice. For example, in order to ensure hardness or strength, it may be difficult to adjust the kind of the filler or the filler content of the first resin part 31. On the other hand, it is possible to increase adhesion of the second resin part 32 to a below-described first insulating layer 41 by adjusting the kind of the filler or the filler content of the second resin part 32. That is, compared with the case of forming the first insulating layer 41 directly on the first resin part 31, it is possible to increase adhesion of the resin part 30 to the first insulating layer 41 by forming the first insulating layer 41 on the second resin part 32 allowing more latitude of material choice (that is, by interposing the second resin part 32 between the first insulating layer 41 and the first resin part 31).

Further, the first resin part 31, which is formed by, for example, compression molding, contains fine air bubbles of approximately several μm in size. These air bubbles are exposed at the surface of the first resin part 31 to be fine bubbles of approximately several μm in size. According to this embodiment, since the second resin part 32 is stacked on the first resin part 31, it is possible to fill these fine holes with the second resin part 32. Therefore, there is no reliability problem due to the presence of fine holes.

A width $W_2$ of the first resin part 31, which is the width of the first resin part 31 between the side surfaces of the semiconductor chip 20 and the side surfaces of the semiconductor package 10, may be, for example, approximately 3 mm. A width $W_3$ of the first resin part 31 may be, for example, approximately 15 mm. A thickness $T_3$ of the first resin part 31 may be, for example, approximately 300 μm to approximately 500 μm. A thickness $T_4$ of the first resin part 31, which is the thickness of the first resin part 31 between the bottom surface of the semiconductor chip 20 and the bottom surface of the semiconductor package 10, may be, for example, approximately 0 μm to approximately 100 μm. If the thickness $T_4$ of the first resin part 31 is 0 μm, the bottom surface of the semiconductor chip 20 is exposed from the first resin part 31 so as to improve the heat radiation performance of the semiconductor chip 20.

A thickness $T_5$ of the second resin part 32 may be, for example, approximately 100 μm to approximately 200 μm. The upper surface of the second resin part 32, which is a surface in contact with the first insulating layer 41, is raised approximately several μm relative to the circuit surface of the semiconductor chip 20. That is, the upper surface of the second resin part 32 is positioned approximately several μm above the level of the circuit surface of the semiconductor chip 20.

The interconnection structure 40 includes the first insulating layer 41, a first interconnection layer 42, a second insulating layer 43, a second interconnection layer 44, and a solder resist layer 45, which are successively stacked. A thickness $T_6$ of the interconnection structure 40 may be, for example, approximately 30 μm to approximately 50 μm.

The first insulating layer 41 is so formed on the circuit surface of the semiconductor chip 20 and the upper surface of the second resin part 32 as to cover the electrode pads 22 of the semiconductor chip 20. Examples of the material of the first insulating layer 41 include insulating resins such as epoxy resin and polyimide resin. The first insulating layer 41 may be, for example, approximately 10 μm in thickness. As described above, by selecting a material for the second resin part 32 in consideration of adhesion to the first insulating layer 41, it is possible to increase adhesion between the second resin part 32 and the first insulating layer 41.

The first interconnection layer 42 is formed on the first insulating layer 41. The first interconnection layer 42 includes via interconnects filling in first via holes 41x formed through the first insulating layer 41 to expose the upper surfaces of the electrode pads 22; and interconnection patterns formed on the first insulating layer 41. The first interconnection layer 42 is electrically connected to the electrode pads 22 exposed in the first via holes 41x. Examples of the material of the first interconnection layer 42 include copper (Cu). The interconnection patterns of the first interconnection layer 42 may be, for example, approximately 5 μm in thickness.

The second insulating layer 43 is so formed on the first insulating layer 41 as to cover the first interconnection layer 42. Examples of the material of the second insulating layer 43 include insulating resins such as epoxy resin and polyimide resin. The second insulating layer 43 may be, for example, approximately 10 μm in thickness.

The second interconnection layer 44 is formed on the second insulating layer 43. The second interconnection layer 44 includes via interconnects filling in second via holes 43x formed through the second insulating layer 43 to expose the upper surface of the first interconnection layer 42; and interconnection patterns formed on the second insulating layer 43. The second interconnection layer 44 is electrically connected to the first interconnection layer 42 exposed in the second via holes 43x. Examples of the material of the second interconnection layer 44 include copper (Cu). The interconnection patterns of the second interconnection layer 44 may be, for example, approximately 5 μm in thickness.

The solder resist layer 45 is so formed on the second insulating layer 43 as to cover the second interconnection layer 44. The solder resist layer 45 includes openings 45x, in which part of the second insulating layer 44 is exposed. Examples of the material of the solder resist layer 45 include photosensitive resin compositions containing one or more insulating resins such as epoxy resin and imide resin. The solder resist layer 45 may be, for example, approximately 10 μm in thickness.

A metal layer or the like may be formed on the second interconnection layer 44 exposed in the openings 45x as desired. Examples of the metal layer include a gold (Au) layer; a nickel/gold (Ni/Au) layer (a metal layer formed of a Ni layer and a Au layer stacked in this order); and a nickel/palladium/gold (Ni/Pd/Au) layer (a metal layer formed of a Ni layer, a Pd layer, and a Au layer stacked in this order).

The external connection terminals 49 are formed on the second interconnection layer 44 (on the metal layer or the like if the metal layer or the like is formed on the second interconnection layer 44) exposed in the openings 45x of the solder resist layer 45 of the interconnection structure 40. According to this embodiment, the semiconductor package 10 has a so-called "fan-out" structure, where a region where the external connection terminals 49 are formed is extended to the periphery of a region immediately above the semiconductor chip 20. That is, the interconnection layers 42 and 44 may be provided so that the external connection terminals 49 are positioned above the second resin part 32. This allows the pitch between adjacent external connection terminals 49 to be wider than the pitch between adjacent electrode pads 22 (for example, 100 μm), for example, 200 μm. The semiconductor package 10 may also have a so-called "fan-in" structure in accordance with its purpose.

The external connection terminals 49 serve as terminals to be electrically connected to pads provided on a mounting board such as a motherboard (not graphically illustrated). Examples of the external connection terminals 49 include solder balls. Examples of the material of solder balls include an alloy containing lead (Pb); an alloy of tin (Sn) and copper (Cu); an alloy of tin (Sn) and silver (Ag); and an alloy of tin (Sn), silver (Ag), and copper (Cu). It is also possible to use lead pins or the like as the external connection terminals 49.

According to this embodiment, the external connection terminals 49 are formed. However, the external connection terminals 49 may not be formed. That is, it may be sufficient for the second interconnection layer 44 to be partially exposed in the solder resist layer 45 so as to allow future formation of the external connection terminals 49 or the like as desired.

Figure 3A:
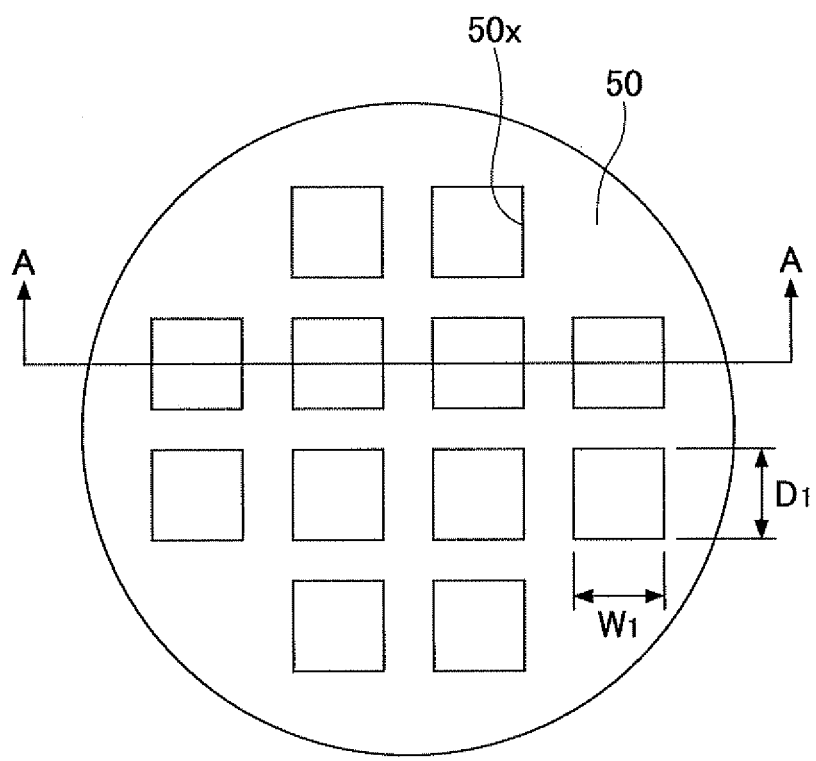
FIGS. 3A through 3P are diagrams illustrating a method of manufacturing a semiconductor package according to the first embodiment.

Next, a description is given of a method of manufacturing a semiconductor package according to the first embodiment. FIGS. 3A through 3P are diagrams illustrating processes for manufacturing a semiconductor package according to the first embodiment.

Figure 3B:
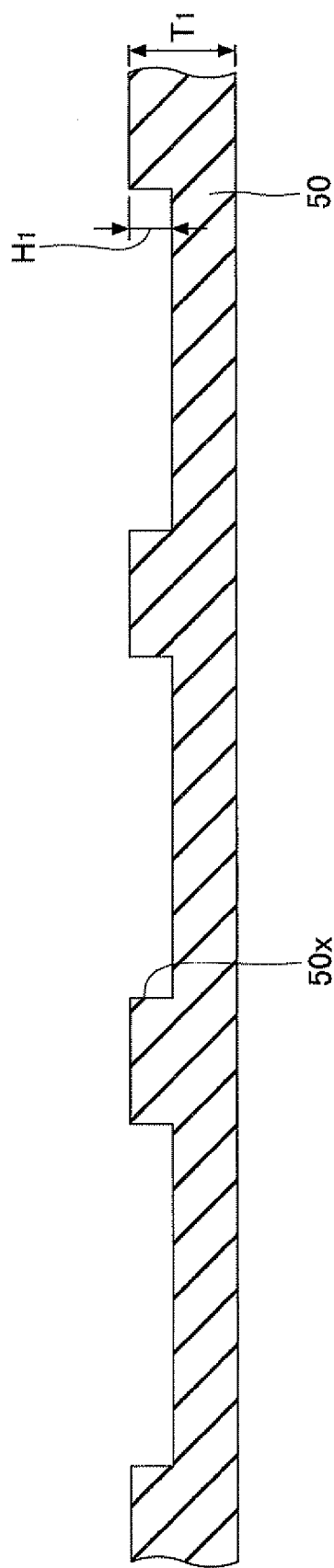

First, in the process illustrated in FIGS. 3A and 3B, a supporting body 50 having multiple recesses 50x is prepared. (Hereinafter, the multiple recesses 50x may also be collectively referred to as "recess 50x" for convenience of description where appropriate.) FIG. 3A is a plan view of the supporting body 50. FIG. 3B is a cross-sectional view of the supporting body 50 taken along line A-A of FIG. 3A. The supporting body 50 may be, but is not limited to, a copper plate. In addition to the copper plate, examples of the supporting body 50 include plates of other metals such as iron and nickel, a silicon substrate, a ceramic substrate, and a glass substrate. In this embodiment, the case of using a copper plate, which is easily removable by etching in the below-described process of removing the supporting body 50 (FIG. 3G), is illustrated.

The multiple recesses 50x may be formed by, for example, removing predetermined portions of a copper plate having a circular planar shape by etching. Alternatively, the multiple recesses 50x may also be formed by, for example, performing spot facing or press working on a copper plate having a circular planar shape. Further, the multiple recesses 50x may also be formed by joining (for example, sticking together) a first copper plate having a circular planar shape and a second copper plate having a circular planar shape, the first copper plate having through holes corresponding in size to the recesses 50x formed by press working and the second copper plate having no through holes formed.

The supporting body 50 may be, for example, approximately 200 mm in diameter. A thickness $T_1$ of the supporting body 50 may be, for example, approximately 1 mm. A width $W_1$ and a depth (length) $D_1$ of the recess 50x may be, for example, approximately 15 mm each. Further, a height $H_1$ of the recess 50x may be, for example, approximately 200 μm. The recess 50x is where the semiconductor chip 20 is placed on an adhesive layer 51 in a below-described process (FIG. 3E). Therefore, the width $W_1$ and depth $D_1$ of the recess 50x are suitably determined, taking the thickness of the adhesive layer 51 also into consideration, to be slightly larger than the width and depth, respectively, of the semiconductor chip 20. Further, the height $H_1$ of the recess 50x may be set to any value as long as the height $H_1$ makes it possible to prevent the semiconductor chip 20 from being displaced in a below-described process (FIG. 3F).

In this embodiment, the case is illustrated where a copper plate having a circular planar shape with the multiple recesses 50x is used as the supporting body 50. However, the planar shape of the copper plate is not limited to a circle, and may be, for example, a rectangle. Further, in FIG. 3A, the supporting body 50 is graphically illustrated as having twelve recesses 50x for simplification of the drawing. However, the supporting body 50 may also be provided with more recesses.

Figure 3C:
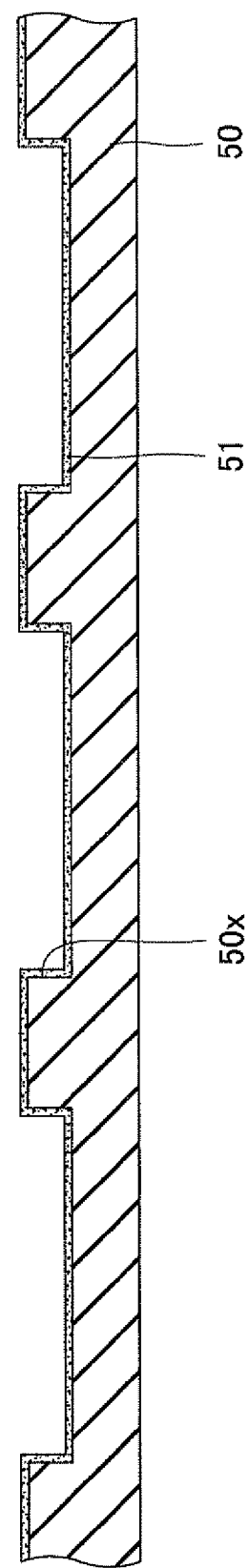
Figure 30:
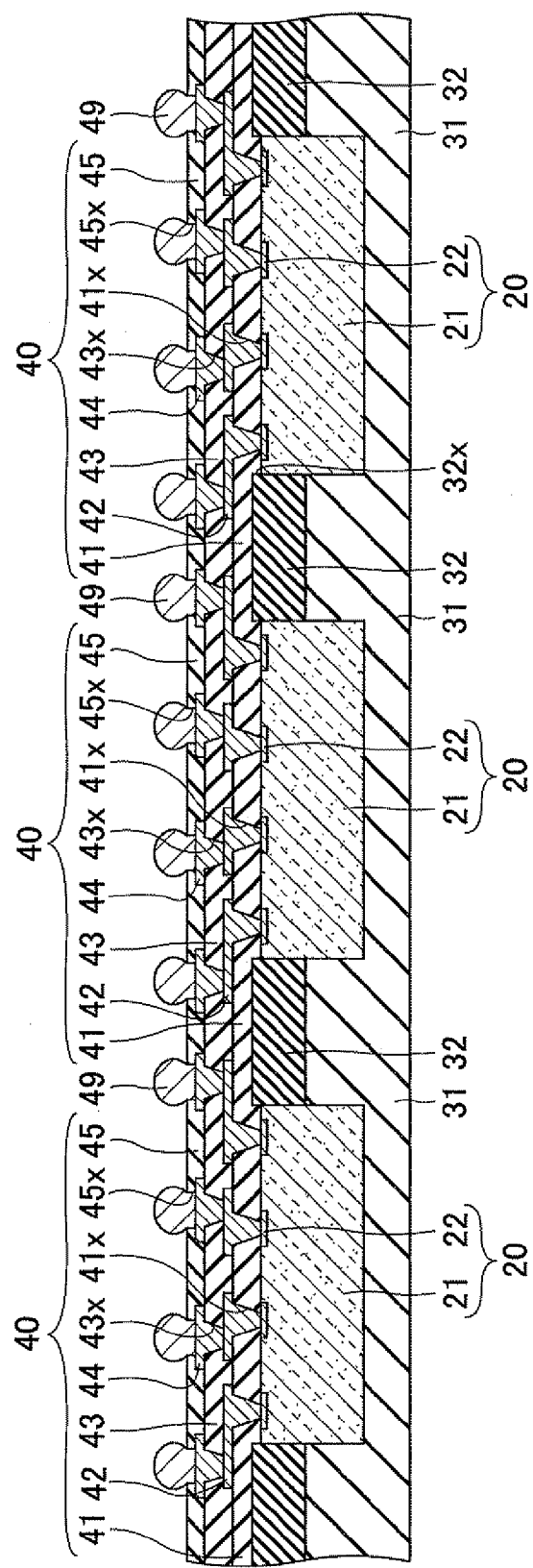
Figure 3P:
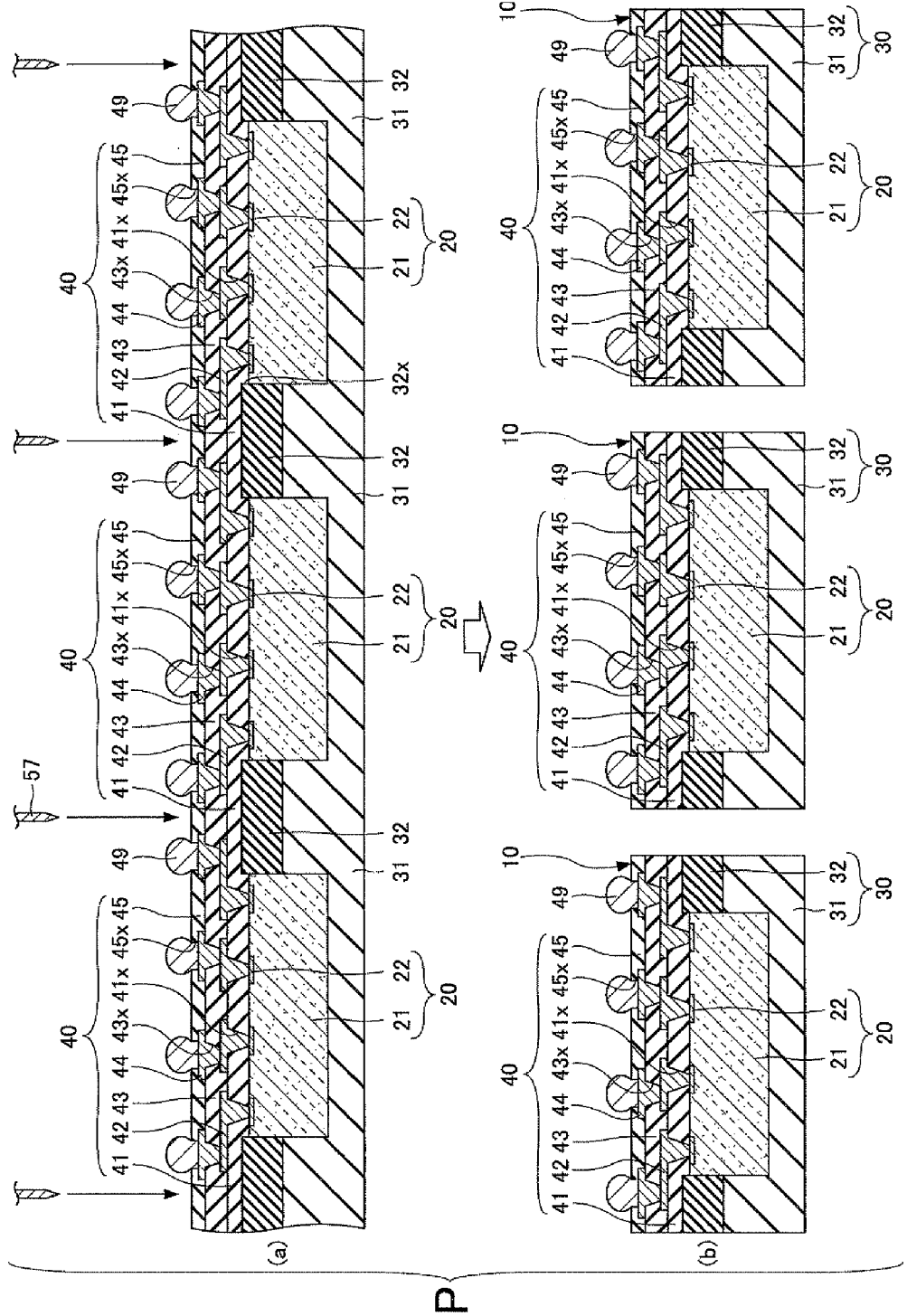

Next, in the process illustrated in FIG. 3C, the adhesive layer 51 is formed on one side of the supporting body 50 including the inner wall surfaces (the inside bottom surface and the inside surfaces) of the recesses 50x. The adhesive layer 51 may be formed by, for example, laminating the one side of the supporting body 50 including the inner wall surfaces of the recesses 50x with a two-sided adhesive agent film in a vacuum atmosphere. The adhesive layer 51 may be, for example, approximately 100 μm in thickness.

Next, in the process illustrated in FIG. 3D, a predetermined number of semiconductor chips 20 each having the electrode pads 22 formed on the circuit surface side of the semiconductor substrate 21 are prepared. Preferably, the semiconductor chips 20 are not reduced in thickness at this stage for facilitation of their handling in subsequent processes. However, the semiconductor chips 20 may be reduced in thickness at this stage as desired. The thickness $T_2$ of the semiconductor chip 20 may be, for example, approximately 300 μm to approximately 800 μm.

Next, in the process illustrated in FIG. 3E, the semiconductor chips 20 are placed in the corresponding recesses 50x of the supporting body 50 in a face-down manner with the adhesive layer 51 interposed between the semiconductor chips 20 and the recesses 50x. That is, the semiconductor chips 20 are placed in the corresponding recesses 50x so that their electrode pads 22 are in contact with the adhesive layer 51 on the inside bottom surfaces of the recesses 50x. The semiconductor chips 20 are temporarily fixed and adhered to the inside of the recesses 50x with the adhesive layer 51.

The supporting body 50 and the semiconductor chips 20 are provided in advance with alignment marks for positioning. By recognizing the alignment marks of the supporting body 50 and the semiconductor chips 20 using a predetermined positioning apparatus, and positioning the semiconductor chips 20 relative to the supporting body 50, it is possible to place the semiconductor chips 20 in the corresponding recesses 50x of the supporting body 50. The semiconductor chips 20 project from the recesses 50x of the supporting body 50 on their bottom surface side.

Next, in the process illustrated in FIG. 3F, the first resin part 31 to encapsulate the semiconductor chips 20 is formed on the adhesive layer 51. The first resin part 31 may be formed by, for example, compression molding. Specifically, for example, the structure illustrated in FIG. 3F is mounted in a lower mold, and a resin to become the first resin part 31 is applied to the structure on its semiconductor chip 20 side. Then, the structure illustrated in FIG. 3E on which the resin to become the first resin part 31 is applied is held between the lower mold and an upper mold, and is further subjected to pressing and heating, so that the resin to become the first resin part 31 has its thickness made uniform and is hardened. As a result, the first resin part 31 encapsulating the semiconductor chips 20 is formed.

The thickness T3 of the first resin part 31 may be, for example, approximately 300 μm to approximately 500 μm. The thickness $T_4$ of the first resin part 31 may be, for example, approximately 50 μm to approximately 100 μm. Examples of the material of the first resin part 31 include thermosetting insulating resins such as epoxy resin and polyimide resin. Since the first resin part 31 forms part of the base body of the semiconductor package 10, it is preferable to use a resin material better in hardness or strength than in processability for the first resin part 31.

As described above, the conventional method of manufacturing a semiconductor package has a problem in that when multiple semiconductor chips are encapsulated together with resin, the semiconductor chips are moved by a flow of the resin to be displaced and fixed to positions different from where the semiconductor chips are supposed to be fixed. However, according to the method of manufacturing a semiconductor package of this embodiment, the semiconductor chips 20 are temporarily fixed and adhered to the corresponding recesses 50x through the adhesive layer 51 (interposed between the semiconductor chips 20 and the recesses 50x). Therefore, even if there is a flow of the resin, there is no displacement of the semiconductor chips 20. Accordingly, upon hardening of the first resin part 31, the semiconductor chips 20 are fixed to positions where the semiconductor chips 20 are supposed to be. As a result, the connection between the electrode pads 22 of the semiconductor chips 20 and the interconnection structure 40 becomes more reliable.

Next, in the process illustrated in FIG. 3G, the supporting body 50 and the adhesive layer 51 are removed from the structure illustrated in FIG. 3F. According to this embodiment, the supporting body 50 is a copper plate. Accordingly, the supporting body 50 may be removed by wet etching using, for example, a ferric chloride aqueous solution or the like. The adhesive layer 51 may be mechanically removed after removal of the supporting body 50. As a result of this process, the electrode pads 22 of the semiconductor chips 20 are exposed from the first resin part 31.

Next, in the process illustrated in FIG. 3H, the second resin part 32 to encapsulate the circuit surfaces and the side surfaces of the semiconductor chips 20 including the electrode pads 22 is formed on one side of the first resin part 31. In FIG. 3H, the structure of FIG. 3G is illustrated upside down. Examples of the material of the second resin part 32 include insulating resins such as epoxy photosensitive resin and polyimide photosensitive resin in the form of a sheet, liquid, or paste.

In the case of using insulating resin such as epoxy photosensitive resin or polyimide photosensitive resin in the form of a sheet as the material of the second resin part 32, the one side of the first resin part 31 is laminated with the sheet-shaped second resin part 32 to cover the circuit surfaces and the side surfaces of the semiconductor chips 20 including the electrode pads 22, and the sheet-shaped second resin part 32 is heated and hardened. Performing lamination with the second resin part 32 in a vacuum atmosphere makes it possible to prevent entrainment of voids into the second resin part 32.

In the case of using insulating resin such as epoxy photosensitive resin or polyimide photosensitive resin in the form of liquid or paste as the material of the second resin part 32, the liquid or paste second resin part 32 is so applied on the one side of the first resin part 31 by, for example, printing or spin coating as to cover the circuit surfaces and the side surfaces of the semiconductor chips 20 including the electrode pads 22, and the liquid or paste second resin part 32 is heated and hardened.

Next, in the process illustrated in FIG. 3I, the second resin part 32 is removed from the circuit surfaces of the semiconductor chips 20 to form openings 32x to expose the circuit surfaces of the semiconductor chips 20 including the electrode pads 22. In the case of using photosensitive resin as the second resin part 32, the openings 32x may be formed by exposing to light and developing the second resin part 32 on the circuit surfaces of the semiconductor chips 20.

For example, a positive photosensitive resin is used as the second resin part 32, and exposure light is emitted onto only the portions of the second resin part 32 formed on the circuit surfaces of the semiconductor chips 20 through a mask having predetermined openings. Then, the exposed portions of the second resin part 32 are removed by etching using, for example, a developer such as an alkaline developer, thereby forming the openings 32x. Alternatively, a negative photosensitive resin may be used as the second resin part 32, and exposure light may be emitted onto the portion of the second resin part 32 other than the portions formed on the circuit surfaces of the semiconductor chips 20 through a mask having a predetermined opening. Then, the unexposed portions of the second resin part 32 are removed by etching using, for example, a developer containing an organic solvent or the like, thereby forming the openings 32x.

Further, in the case of not using photosensitive resin as the second resin part 32, the second resin part 32 on the circuit surfaces of the semiconductor chips 20 may be removed by, for example, plasma ashing. Specifically, for example, $O_2$ plasma ashing or the like is performed through a mask that exposes only the portions of the second resin part 32 formed on the circuit surfaces of the semiconductor chips 20. According to $O_2$ plasma ashing, an object is oxidized in a vacuum atmosphere by oxygen radicals and oxygen ions created in a plasma into which oxygen gas has been excited, and is removed as gaseous reaction products such as CO and $CO_2$. Various inert gases may be added to the supplied oxygen gas as desired. Examples of inert gases include argon-based gas, hydrogen-based gas, nitrogen-based gas, and CF-based gases such as $CF_4$ and $C_2F_6$.

Next, in the process illustrated in FIG. 3J, the first insulating layer 41 is so formed in the openings 32x (on the circuit surfaces of the semiconductor chips 20) and on the second resin part 32 as to cover the electrode pads 22 of the semiconductor chips 20. Examples of the material of the first insulating layer 41 include thermosetting insulating resins such as epoxy resin and polyimide resin in the form of a sheet, liquid, or paste. In order to facilitate formation of the first via holes 41x in the first insulating layer 41 by laser processing in a below-described process (FIG. 3K), it is preferable to use, for example, a resin material containing filler and having good processability for the first insulating layer 41. The first insulating layer 41 may be, for example, approximately 10 μm in thickness.

In the case of using insulating resin such as epoxy resin or polyimide resin in the form of a sheet with a thermosetting characteristic as the material of the first insulating layer 41, lamination with the first insulating layer 41 is performed in the openings 32x (on the circuit surfaces of the semiconductor chips 20) and on the second resin part 32 so that the electrode pads 22 of the semiconductor chips 20 is covered with the first insulating layer 41. Then, while being pressed, the first insulating layer 41 is heated to a temperature higher than or equal to its setting temperature to be hardened. Performing lamination with the first insulating layer 41 in a vacuum atmosphere makes it possible to prevent entrainment of voids into the first insulating layer 41.

In the case of using insulating resin such as epoxy resin or polyimide resin in the form of liquid or paste with a thermosetting characteristic as the material of the first insulating layer 41, the liquid or paste first insulating layer 41 is so applied to the inside of the openings 32x (on the circuit surfaces of the semiconductor chips 20) and on the second resin part 32 by, for example, spin coating as to cover the electrode pads 22 of the semiconductor chips 20. Then, the applied first insulating layer 41 is heated to a temperature higher than or equal to its setting temperature to be hardened.

Next, in the process illustrated in FIG. 3K, the first via holes 41x are formed through the first insulating layer 41 to expose the upper surfaces of the electrode pads 22. The first via holes 41x may be formed by, for example, laser processing using a $CO_2$ laser or the like. Alternatively, the first via holes 41x may also be formed by patterning the first insulating layer 41 by photolithography using photosensitive resin as the first insulating layer 41. Further, the first via holes 41x may also be formed by printing and hardening paste resin through a screen mask that masks positions corresponding to the first via holes 41x.

Next, in the process illustrated in FIG. 3L, the first interconnection layer 42 is formed on the first insulating layer 41. The first interconnection layer 42 includes via interconnects with which the first via holes 41x are filled and interconnection patterns formed on the first insulating layer 41. The first interconnection layer 42 is directly connected electrically to the electrode pads 22 exposed in the first via holes 41x. Examples of the material of the first interconnection layer 42 include copper (Cu).

The first interconnection layer 42 is formable with various interconnection forming methods such as a semi-additive process and a subtractive process. By way of example, a method of forming the first interconnection layer 42 using a semi-additive process is illustrated below.

First, a seed layer (not graphically illustrated) of copper (Cu) or the like is formed on the upper surfaces of the electrode pads 22 exposed in the first via holes 41x and on the first insulating layer 41 including the inner wall surfaces of the first via holes 41x by electroless plating or sputtering. Further, a resist layer (not graphically illustrated) having openings corresponding to the first interconnection layer 42 is formed on the seed layer. Then, an interconnection layer (not graphically illustrated) of copper (Cu) is formed in the openings of the resist layer by electroplating using the seed layer as a (power) feed layer. Next, after removal of the resist layer, part of the seed layer not covered with the interconnection layer is removed by etching. As a result, the first interconnection layer 42 is formed on the first insulating layer 41.

Next, in the process illustrated in FIG. 3M, the second insulating layer 43, the second via holes 43x, and the second interconnection layer 44 are formed. For example, first, through the same process as illustrated in FIG. 3J, the second insulating layer 43 is so formed on the first insulating layer 41 as to cover the first interconnection layer 42. Then, through the same process as illustrated in FIG. 3K, the second via holes 43x are formed through the second insulating layer 43 to expose the upper surface of the first interconnection layer 42. The material and thickness of the second insulating layer 44 may be the same as the material and thickness, respectively, of the first insulating layer 41.

Further, through the same process as illustrated in FIG. 3L, the second interconnection layer 44 is formed on the second insulating layer 43. The second interconnection layer 44 includes via interconnects with which the second via holes 43x are filled and interconnection patterns formed on the second insulating layer 43. The second interconnection layer 44 is electrically connected to the first interconnection layer 42 exposed in the second via holes 43x. Examples of the material of the second interconnection layer 44 include copper (Cu). The second interconnection layer 44 is formable with various interconnection forming methods such as a semi-additive process and a subtractive process.

Through the processes of FIG. 3J through 3M, two build-up interconnection layers (the first interconnection layer 42 and the second interconnection layer 44) are formed on the circuit surfaces of the semiconductor chips 20 and the second resin part 32. The number of build-up interconnection layers may be one, or n build-up interconnection layers may be formed by further repeating the process of FIG. 3M as many times as desired after the process of FIG. 3M (where n is an integer greater than or equal to three).

Next, in the process illustrated in FIG. 3N, the solder resist layer 45 having the openings 45x is so formed on the second insulating layer 43 as to cover the second interconnection layer 44. For example, solder resist formed of, for example, a photosensitive resin composition containing insulating resin such as epoxy resin or imide resin is so applied on the second insulating layer 43 as to cover the second interconnection layer 44. Then, the applied solder resist is exposed to light and developed, thereby forming the openings 45x. As a result, the solder resist layer 45 having the openings 45x is formed. Part of the second interconnection layer 44 is exposed in the openings 45x of the solder resist layer 45. A metal layer or the like may be formed on the second interconnection layer 44 exposed in the openings 45x as desired. Examples of the metal layer include a gold (Au) layer; a nickel/gold (Ni/Au) layer (a metal layer formed of a Ni layer and a Au layer stacked in this order); and a nickel/palladium/gold (Ni/Pd/Au) layer (a metal layer formed of a Ni layer, a Pd layer, and a Au layer stacked in this order), which may be formed by electroless plating.

Through the processes of FIGS. 3J through 3N, the interconnection structure 40 is formed on the circuit surfaces of the semiconductor chips 20 and the second resin part 32. In the processes illustrated in FIGS. 3J through 3N, the first resin part 31 serves as part of the base body in the formation of the interconnection structure 40 on the semiconductor chips 20.

Next, in the process illustrated in FIG. 3O, the external connection terminals 49 are formed on the second interconnection layer 44 (on the metal layer or the like if the metal layer or the like is formed on the second interconnection layer 44) exposed in the openings 45x. According to this embodiment, the semiconductor package 10 has a so-called "fan-out" structure, where a region where the external connection terminals 49 are formed is extended to the periphery of a region immediately above the semiconductor chips 20. Alternatively, the semiconductor package 10 may also have a so-called "fan-in" structure in accordance with its purpose.

The external connection terminals 49 serve as terminals to be electrically connected to pads provided on a mounting board such as a motherboard (not graphically illustrated). Examples of the external connection terminals 49 include solder balls. Examples of the material of solder balls include an alloy containing lead (Pb); an alloy of tin (Sn) and copper (Cu); an alloy of tin (Sn) and silver (Ag); and an alloy of tin (Sn), silver (Ag), and copper (Cu).

The external connection terminals 49 may be formed by, for example, mounting solder balls on the second interconnection layer 44 (on the metal layer or the like if the metal layer or the like is formed on the second interconnection layer 44) after application of flux as a surface treatment agent; subjecting the solder balls to a reflow process at a temperature of approximately 240° C. to approximately 260° C.; and thereafter cleaning their surfaces to remove the flux.

According to this embodiment, the external connection terminals 49 are formed. However, the external connection terminals 49 may not be formed. That is, it may be sufficient for the second interconnection layer 44 to be partially exposed in the solder resist layer 45 so as to allow future formation of the external connection terminals 49 or the like as desired.

Next, in the process illustrated in FIG. 3P, the structure illustrated in FIG. 3O ((a) of FIG. 3P) is cut at predetermined positions into individual pieces (dies) ((b) of FIG. 3P). As a result, the semiconductor package 10 illustrated in FIG. 2 is completed. The structure illustrated in FIG. 3O may be cut by, for example, dicing using dicing blades 57. This individualization (singulation) is performed by cutting the first resin part 31, the second resin part 32, and the interconnection structure 40 between adjacent semiconductor chips 20. At this point, multiple semiconductor chips 20 may be cut off into a single piece (die). In this case, a semiconductor package having multiple semiconductor chips 20 is manufactured.

Further, for example, a process for reducing the thickness of the first resin part 31 may be interposed between the process illustrated in FIG. 3N and the process illustrated in FIG. 3O. Specifically, for example, the first resin part 31 is made thinner by grinding the first resin part 31 from its bottom surface side (the side on which the interconnection structure 40 is not formed) using a grinder or the like. The first resin part 31 may be ground until the bottom surfaces of the semiconductor chips 20 are exposed from the first resin part 31. At this point, the semiconductor chips 20 also may be ground to be reduced in thickness. The semiconductor chips 20 are better in heat radiation performance with their bottom surfaces exposed from the first resin part 31.

Thus, according to the first embodiment, in the process of encapsulating semiconductor chips with resin, the semiconductor chips are temporarily fixed and adhered through an adhesive layer to recesses formed in the supporting body. Therefore, even if there is a flow of the resin, it is possible to prevent displacement of the semiconductor chips.

Further, since no displacement of the semiconductor chips occurs, the individual semiconductor chips are fixed to positions where the semiconductor chips are supposed to be once the resin encapsulating the semiconductor chip is hardened. As a result, it is possible to increase the reliability of the connection between the electrode pads of each semiconductor chip and the interconnection structure.

Further, use of photosensitive resin as the second resin part in the process of removing the supporting body and filling the stepped parts between the first resin part and the semiconductor chips with the second resin part facilitates removal of the second resin part covering the circuit surfaces of the semiconductor chips in the subsequent process.

Further, instead of being formed directly on the first resin part, the first insulating layer is formed over the first resin part with the interposition of the second resin part allowing more latitude of material choice. This makes it possible to increase adhesion between the resin part and the first insulating layer.

Further, since the second resin part whose surface is free of fine holes is stacked on the first resin part with fine holes at its surface, it is possible to avoid a reliability problem due to the presence of fine holes.

Further, since the semiconductor chips and the interconnection structure (the electrode pads of the semiconductor chips and the via interconnects of the interconnection layers) are directly connected without using solder bumps or the like, it is possible to reduce the thickness of the semiconductor package.

Further, reduction in the thickness of the semiconductor package makes it possible to connect the semiconductor chips and the interconnection structure with shorter interconnects. Accordingly, it is possible to make improvement in electrical characteristics, such as reduction in loop inductance.

[b] Second Embodiment

Next, a description is given of a semiconductor package according to a second embodiment.

FIG. 4 is a cross-sectional view of a semiconductor package 60 according to the second embodiment. Referring to FIG. 4, the semiconductor package 60 is different from the semiconductor package illustrated in FIG. 2 in, for example, that the resin part 30 is replaced with a resin part 61 and that bump electrodes 23 are formed on the electrode pads 22. In the following description of the semiconductor package 60, the same elements as those of the semiconductor package 10 are referred to by the same reference characters or numerals, and a description thereof is omitted.

Referring to FIG. 4, the semiconductor package 60 has the extremely thin interconnection structure 40 formed on a surface defined by the resin part 61, and has the external connection terminals 49 formed on the interconnection structure 40. The semiconductor chip 20 and the interconnection structure 40 are directly connected without use of solder bumps or the like.

The semiconductor chip 20 includes the semiconductor substrate 21, the electrode pads 22, and the bump electrodes 23. The bump electrodes 23 are formed on the corresponding electrode pads 22. Examples of the bump electrodes 23 include columnar copper (Cu) posts. The bump electrodes 23 may be, for example, approximately 50 μm in diameter. The bump electrodes 23 may be, for example, approximately 5 μm to approximately 10 μm in height. The pitch between adjacent bump electrodes 23 may be, for example, approximately 100 μm. A thickness $T_7$ of the semiconductor chip 20 may be, for example, approximately 300 μm to approximately 800 μm.

The resin part 61 is so formed as to encapsulate the circuit surface of the semiconductor chip 20 (except for where the bump electrodes 23 are formed), the side surfaces of the semiconductor chip 20, and the side surfaces of the bump electrodes 23. In other words, the upper surfaces of the bump electrodes 23 of the semiconductor chip 20 and the bottom surface of the semiconductor chip 20 are exposed from the resin part 61. Further, the upper surface (surface in contact with the first insulating layer 41) of the resin part 61 and the upper surfaces (surfaces in contact with the via interconnects of the first interconnection layer 42) of the bump electrodes 23 are level with each other (in the same plane). The upper surface of the resin part 61 and the upper surfaces of the bump electrodes 23, which are ground as described below, enjoy excellent planarity.

Examples of the material of the resin part 61 include insulating resins such as epoxy resin and polyimide resin. Since the resin part 61 forms part of the base body of the semiconductor package 60, it is preferable to use a resin material better in hardness or strength than in processability for the resin part 61.

Since the circuit surface of the semiconductor chip 20 is thus encapsulated with the resin part 61, for which a resin material better in hardness or strength than in processability is used, it is possible to increase reliability with respect to the protection of the circuit surface of the semiconductor chip 20. Further, since the upper surface of the resin part 61 and the upper surfaces of the bump electrodes 23 form a surface having good planarity, it is possible to increase adhesion to the first insulating layer 41. Further, since the bottom surface of the semiconductor chip 20 is exposed from the resin part 61, it is possible to improve the heat radiation performance of the semiconductor chip 20.

A width $W_4$ of the resin part 61, which is the width of the resin part 61 between the side surfaces of the semiconductor chip 20 and the side surfaces of the semiconductor package 60, may be, for example, approximately 3 mm. A width $W_5$ of the resin part 61 may be, for example, approximately 15 mm. A thickness $T_8$ of the resin part 61 may be, for example, approximately 300 μm to approximately 800 μm.

In the interconnection structure 40, the first interconnection layer 42 includes via interconnects filling in the first via holes 41x formed through the first insulating layer 41 to expose the upper surfaces of the bump electrodes 23; and interconnection patterns formed on the first insulating layer 41. The first interconnection layer 42 is electrically connected to the bump electrodes 23 exposed in the first via holes 41x.

Thus, the semiconductor package 60 has the resin part 61 formed to encapsulate the circuit surface of the semiconductor chip 20 (except for where the bump electrodes 23 are formed), the side surfaces of the semiconductor chip 20, and the side surfaces of the bump electrodes 23; the extremely thin interconnection structure 40 formed on the surface defined by the resin part 61 to be electrically connected to the semiconductor chip 20; and the external connection terminals 49 formed on the interconnection structure 40.

Next, a description is given of a method of manufacturing a semiconductor package according to the second embodiment.

FIGS. 5A through 5E are diagrams illustrating a process for manufacturing a semiconductor package according to the second embodiment.

First, the same processes as those illustrated in FIGS. 3A through 3D of the first embodiment are performed. However, in the process corresponding to that of FIG. 3D, the bump electrodes 23, which may be columnar copper (Cu) posts or the like, are formed on the respective electrode pads 22 of the semiconductor chip 20 by, for example, electroplating. At this point, the bump electrodes 23 may be, for example, approximately 30 μm in height.

Next, in the process illustrated in FIG. 5A, the semiconductor chips 20 are placed in the corresponding recesses 50x of the supporting body in a face-up manner with the adhesive layer 51 interposed between the semiconductor chips 20 and the recesses 50x. That is, the semiconductor chips 20 are placed so that the bottom surfaces of the semiconductor chips 20 are in contact with the adhesive layer 51 formed on the inside bottom surfaces of the recesses 50x. The semiconductor chips 20 are temporarily fixed and adhered to the inside of the recesses 50x with the adhesive layer 51.

The supporting body 50 and the semiconductor chips 20 are provided in advance with alignment marks for positioning. By recognizing the alignment marks of the supporting body 50 and the semiconductor chips 20 using a predetermined positioning apparatus, and positioning the semiconductor chips 20 relative to the supporting body 50, it is possible to place the semiconductor chips 20 in the corresponding recesses 50x of the supporting body 50. The semiconductor chips 20 project from the recesses 50x of the supporting body 50 on their circuit surface side.

Figure 5B:
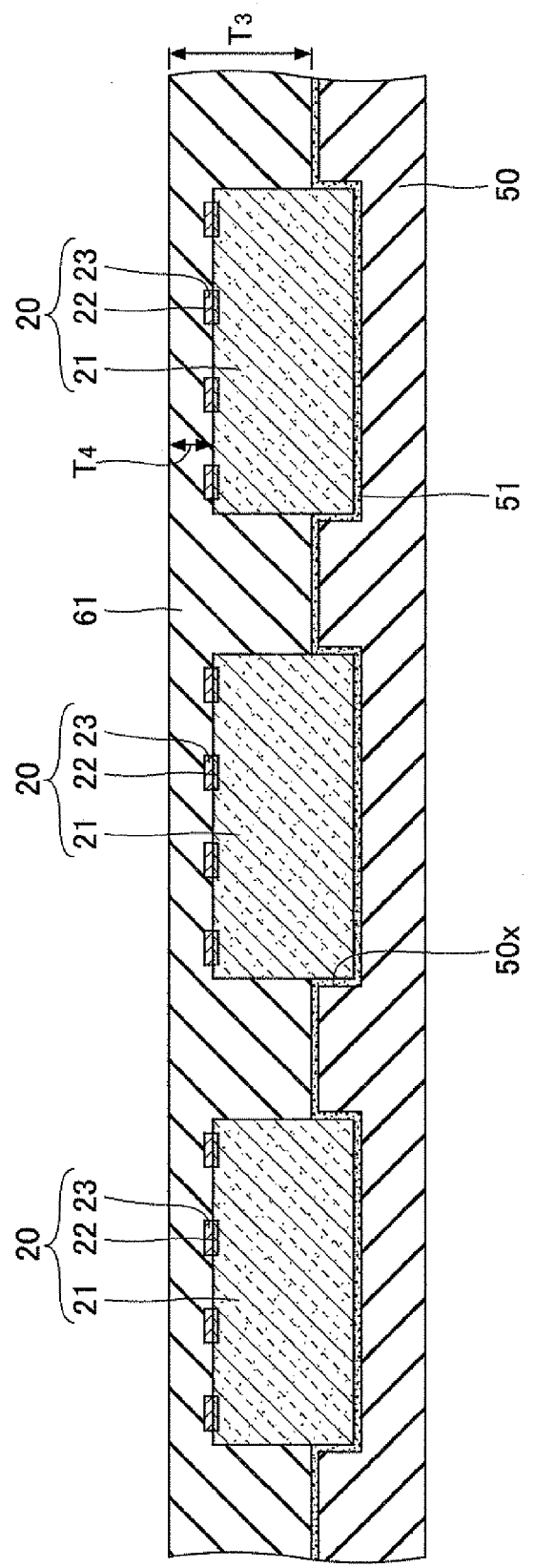

Next, in the process illustrated in FIG. 5B, the resin part 61 to encapsulate the semiconductor chips 20 is formed on the adhesive layer 51. The resin part 61 may be formed by the same method as in the process illustrated in FIG. 3F, and accordingly, a specific description thereof is omitted.

As described above, the conventional method of manufacturing a semiconductor package has a problem in that when multiple semiconductor chips are encapsulated together with resin, the semiconductor chips are moved by a flow of the resin to be displaced and fixed to positions different from where the semiconductor chips are supposed to be fixed. However, according to the method of manufacturing a semiconductor package of this embodiment, the semiconductor chips 20 are temporarily fixed and adhered to the corresponding recesses 50x through the adhesive layer 51 (interposed between the semiconductor chips 20 and the recesses 50x). Therefore, even if there is a flow of the resin, there is no displacement of the semiconductor chips 20. Accordingly, upon hardening of the resin part 61, the semiconductor chips 20 are fixed to positions where the semiconductor chips 20 are supposed to be. As a result, the connection between the bump electrodes 23 of the semiconductor chips 20 and the interconnection structure 40 becomes more reliable.

Figure 5C:
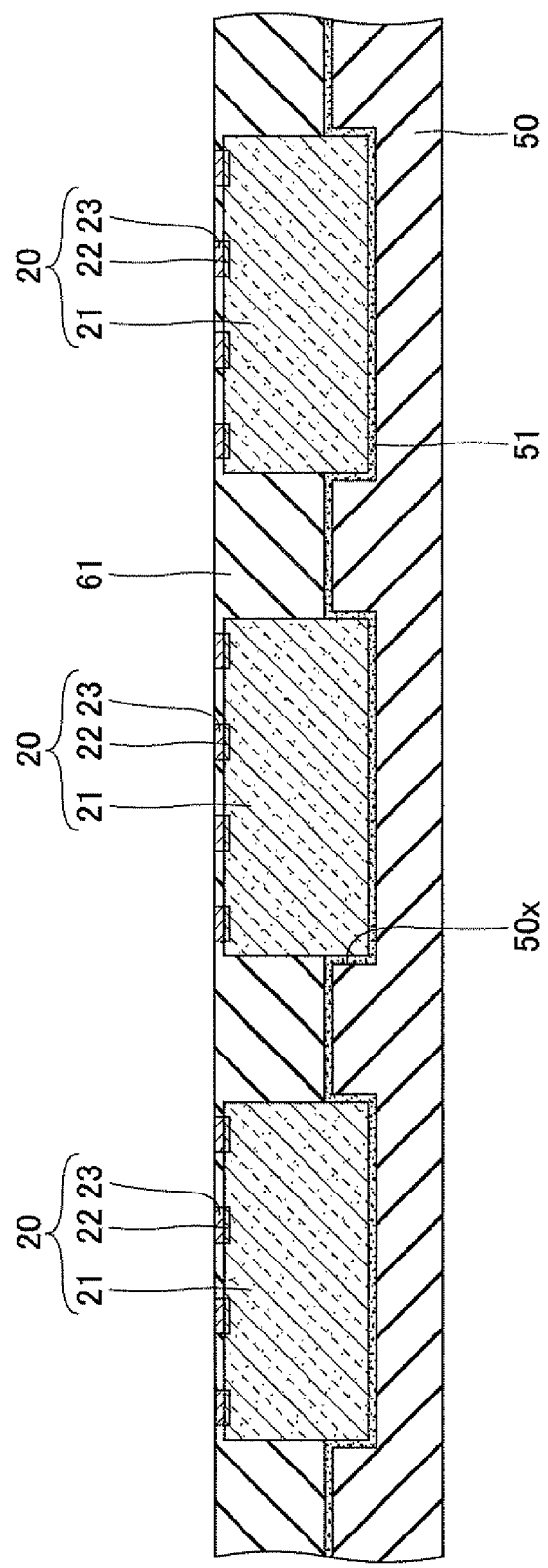

Next, in the process illustrated in FIG. 5C, the structure illustrated in FIG. 5B is ground from its top surface side using a grinder or the like, so that part of the resin part 61 and part of the bump electrodes 23 are removed to expose the bump electrodes 23 in the resin part 61. As a result of this process, the upper surface of the resin part 61 and the exposed surfaces (upper end surfaces exposed from the resin part 61) of the bump electrodes 23 are level with each other (in the same plane). That is, the surface of the structure illustrated in FIG. 5C (the upper surface of the resin part 61 and the exposed surfaces of the bump electrodes 23) is excellent in planarity. As a result, it is possible to increase adhesion between the upper surface of the resin part 61 and the first insulating layer 41 at the time of forming the first insulating layer 41 on the surface of the structure illustrated in FIG. 5C in a subsequent process. The ground bump electrodes 23 may be, for example, approximately 5 μm to approximately 10 μm in height.

Next, in the process illustrated in FIG. 5D, the supporting body 50 and the adhesive layer 51 are removed from the structure illustrated in FIG. 5C. The removal method may be the same as in the process illustrated in FIG. 3G, and accordingly, a description thereof is omitted. As a result of this process, the bottom surfaces and part of the side surfaces of the semiconductor chips 20 are exposed from the resin part 61. That is, the semiconductor chips 20 have their respective portions project from the resin part 61.

Next, in the process illustrated in FIG. 5E, the structure illustrated in FIG. 5D is ground from its bottom surface side using, for example, a grinder or the like, so that the projecting portions of the semiconductor chips 20 are removed. At this point, a reinforcing member may be provided on the top surface side of the structure illustrated in FIG. 5D. (In this case, the reinforcing member is removed after the grinding.) As a result of this process, the bottom surface of the resin part 61 and the bottom surfaces of the semiconductor chips 20 are level with each other (in the same plane). This process may be omitted if the presence of the projecting portions of the semiconductor chips 20 causes no problem.

Next, the same processes as those of FIG. 3J through 3P of the first embodiment are performed, so that the semiconductor package 60 illustrated in FIG. 4 is completed. Alternatively, however, the interconnection structure 40 may be formed by performing the same processes as those of FIGS. 3J through 3N after the process illustrated in FIG. 5C, the processes illustrated in FIGS. 5D and 5E may be performed thereafter, and the same processes as those of FIGS. 3O and 3P may be performed thereafter.

Thus, according to the second embodiment, like in the first embodiment, the semiconductor chips are temporarily fixed and adhered to the recesses formed in the supporting body with the adhesive layer interposed between the semiconductor chips and the recesses in the process of encapsulating the semiconductor chips with resin. Accordingly, even if there is a flow of the resin, it is possible to prevent displacement of the semiconductor chips 20.

Further, since no displacement of the semiconductor chips occurs, the individual semiconductor chips are fixed to positions where the semiconductor chips are supposed to be once the resin encapsulating the semiconductor chip is hardened. As a result, it is possible to increase the reliability of the connection between the bump electrodes of each semiconductor chip and the interconnection structure.

Further, since the circuit surfaces of the semiconductor chips are encapsulated with the resin part using a resin material better in hardness or strength than in processability, it is possible to increase reliability with respect to the protection of the semiconductor chips.

Further, since the upper surface of the resin part and the upper surfaces of the bump electrodes define a surface with good planarity, it is possible to increase adhesion to the first insulating layer.

Further, since the semiconductor chips and the interconnection structure (the bump electrodes of the semiconductor chips and the via interconnects of the interconnection layers) are directly connected without using solder bumps or the like, it is possible to reduce the thickness of the semiconductor package.

Further, reduction in the thickness of the semiconductor package makes it possible to connect the semiconductor chips and the interconnection structure with shorter interconnects. Accordingly, it is possible to make improvement in electrical characteristics, such as reduction in loop inductance.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention.

For example, the bump electrodes 23 of the second embodiment may be formed on the respective electrode pads 22 of the semiconductor chips 20 in the first embodiment.

What is claimed is:

1. A method of manufacturing a semiconductor package, comprising:
   preparing a supporting body having a plurality of recesses provided on a surface thereof;
   placing a plurality of semiconductor chips with a single one of the semiconductor chips in each of the recesses provided on the surface of the supporting body so that the semiconductor chips have respective parts thereof projecting from the corresponding recesses;
   forming a resin part on the surface of the supporting body, the resin part encapsulating the projecting parts of the semiconductor chips;
   removing the supporting body;

forming an interconnection structure electrically connected to the semiconductor chips by using the resin part as a part of a base body of the semiconductor package; and obtaining a plurality of semiconductor packages by cutting the interconnection structure and the resin part after said forming the interconnection structure, so that each of the semiconductor packages includes at least one of the semiconductor chips.

2. The method as claimed in claim 1, wherein:

said placing the plurality of semiconductor chips places the semiconductor chips so that respective circuit surfaces of the semiconductor chips face toward respective inside bottom surfaces of the corresponding recesses;

said forming the resin part covers respective surfaces of the semiconductor chips opposite to the respective circuit surfaces with a first resin part;

said removing the supporting body exposes the circuit surfaces of the semiconductor chips from a surface of the first resin part; and said forming the interconnection structure includes forming a second resin part covering the surface of the first resin part and the circuit surfaces of the semiconductor chips;

removing a part of the second resin part which part covers the circuit surfaces of the semiconductor chips; and forming an insulating layer and an interconnection layer on the second resin part and on the circuit surfaces of the semiconductor chips.

3. The method as claimed in claim 2, wherein:

the second resin part includes a photosensitive resin, and said removing the part of the second resin part removes the part of the second resin part by photolithography.

4. The method as claimed in claim 2, wherein said forming the interconnection structure comprises forming the insulating layer on the second resin part and on the circuit surfaces of the semiconductor chips;

forming a plurality of via holes in the insulating layer to expose respective electrodes of the semiconductor chips; and forming the interconnection layer on the insulating layer, wherein the interconnection layer includes a plurality of vias that are provided in the respective via holes so as to be connected to the electrodes.

5. The method as claimed in claim 1, further comprising:

exposing a part of each of respective circuit surfaces of the semiconductor chips from a first surface of the resin part by grinding the first surface of the resin part after said forming the resin part, wherein said placing the plurality of semiconductor chips places the semiconductor chips so that respective surfaces of the semiconductor chips opposite to the respective circuit surfaces face toward respective inside bottom surfaces of the corresponding recesses, said forming the resin part covers the circuit surfaces of the semiconductor chips with the resin part, said removing the supporting body exposes the surfaces of the semiconductor chips opposite to the circuit surfaces from a second surface of the resin part, and said forming the interconnection structure forms the interconnection structure including an insulating layer and an interconnection layer on the first surface of the resin part and on the parts of the circuit surfaces of the semiconductor chips.

6. The method as claimed in claim 5, wherein:

a bump electrode is formed at each of the circuit surfaces of the semiconductor chips, and said exposing the part of each of the respective circuit surfaces exposes a respective surfaces of the bump electrodes from the first surface of the resin part by grinding the first surface of the resin part.

7. The method as claimed in claim 5, wherein said forming the interconnection structure comprises forming the insulating layer on the first surface of the resin part and on the parts of the circuit surfaces of the semiconductor chips;

forming a plurality of via holes in the insulating layer to expose respective electrodes of the semiconductor chips; and forming the interconnection layer on the insulating layer, wherein the interconnection layer includes a plurality of vias that are provided in the respective via holes so as to be connected to the electrodes.

8. The method as claimed in claim 1, wherein said forming the resin part forms the resin part by resin molding.

9. The method as claimed in claim 1, wherein:

the supporting body is metallic, and said removing the supporting body removes the supporting body by etching.

10. The method as claimed in claim 1, wherein the semiconductor chips have the respective parts thereof projecting out of the corresponding recesses.

11. The method as claimed in claim 1, further comprises:

forming an external connection terminal on the interconnection structure, wherein said forming the interconnection structure includes forming an insulating layer; and forming an interconnection layer on the insulating layer, and wherein the external connection terminal is formed on the interconnection layer.

12. The method as claimed in claim 1, wherein said forming the interconnection structure comprises forming a plurality of insulating layers and a plurality of interconnection layers in alternate layers.

* * * * *